US009362446B2

(12) United States Patent
An

(10) Patent No.: US 9,362,446 B2
(45) Date of Patent: Jun. 7, 2016

(54) SEMICONDUCTOR LIGHT-EMITTING DEVICE

(71) Applicant: Sang Jeong An, Gyeonggi-do (KR)

(72) Inventor: Sang Jeong An, Gyeonggi-do (KR)

(*) Notice: Subject to any disclaimer, the term of this patent is extended or adjusted under 35 U.S.C. 154(b) by 0 days.

(21) Appl. No.: 14/414,384

(22) PCT Filed: Jul. 26, 2013

(86) PCT No.: PCT/KR2013/006742
§ 371 (c)(1),
(2) Date: Jan. 12, 2015

(87) PCT Pub. No.: WO2014/017871
PCT Pub. Date: Jan. 30, 2014

(65) Prior Publication Data
US 2015/0144870 A1    May 28, 2015

(30) Foreign Application Priority Data

Jul. 26, 2012 (KR) .................. 10-2012-0081785
Jul. 26, 2012 (KR) .................. 10-2012-0081788
Sep. 5, 2012 (KR) .................. 10-2012-0098199

(51) Int. Cl.
*H01L 33/00* (2010.01)
*H01L 33/38* (2010.01)
(Continued)

(52) U.S. Cl.
CPC ............ *H01L 33/0025* (2013.01); *H01L 33/06* (2013.01); *H01L 33/32* (2013.01);
(Continued)

(58) Field of Classification Search
CPC ....... H01L 33/382; H01L 33/62; H01L 33/06; H01L 33/0025; H01L 33/32; H01L 33/0079; H01L 25/0753; H01L 2224/48091; H01L 2924/00014
See application file for complete search history.

(56) References Cited

U.S. PATENT DOCUMENTS 6,642,072 B2    11/2003    Inoue et al. .................. 438/26
7,154,123 B2 *  12/2006    Kunisato et al. ............. 257/86
(Continued)

FOREIGN PATENT DOCUMENTS

JP        2001-230448    8/2001    .............. H01L 33/00
KR    10-2003-0038072    5/2003    .............. H01S 5/183
(Continued)

OTHER PUBLICATIONS

International Search Report (ISR) dated Nov. 26, 2013 in PCT/KR2013/006742 with English translation.

*Primary Examiner* — Nikolay Yushin
(74) *Attorney, Agent, or Firm* — Harness, Dickey & Pierce, P.L.C.

(57) ABSTRACT

The present disclosure relates to a semiconductor light emitting device, comprising: a supporting substrate having a first surface and a second surface opposite to the first surface; at least one semiconductor stack formed on the first surface, wherein each stack includes a plurality of semiconductor layers grown sequentially using a growth substrate and composed of a first semiconductor layer, a second semiconductor layer, and an active layer generating light via electron-hole recombination, and wherein a growth substrate-removed surface is formed on the side of the first semiconductor layer; a bonded layer, which bonds the second semiconductor layer side of the plurality of semiconductor layers to the first surface side of the supporting substrate; and a bonded layer-removed surface formed on the first surface, being open towards the plurality of semiconductor layer to supply current thereto.

18 Claims, 23 Drawing Sheets

(51) Int. Cl.
    *H01L 33/62* (2010.01)
    *H01L 33/06* (2010.01)
    *H01L 33/32* (2010.01)
    *H01L 25/075* (2006.01)

(52) U.S. Cl.
    CPC ............ *H01L 33/382* (2013.01); *H01L 33/62* (2013.01); *H01L 25/0753* (2013.01); *H01L 33/0079* (2013.01); *H01L 2224/48091* (2013.01)

(56) References Cited

U.S. PATENT DOCUMENTS

| | | | |
|---|---|---|---|
| 7,973,331 B2 * | 7/2011 | Hsu et al. | 257/99 |
| 8,089,074 B2 * | 1/2012 | Kim et al. | 257/79 |
| 8,344,397 B2 * | 1/2013 | Lerman et al. | 257/88 |
| 8,525,216 B2 * | 9/2013 | Chen et al. | 257/99 |
| 2002/0024053 A1 | 2/2002 | Inoue et al. | 257/79 |
| 2003/0086463 A1 | 5/2003 | Shin et al. | 372/46 |
| 2005/0199891 A1 * | 9/2005 | Kunisato et al. | 257/85 |
| 2008/0211400 A1 * | 9/2008 | Kim et al. | 313/506 |
| 2009/0173963 A1 * | 7/2009 | Hsu et al. | 257/99 |
| 2010/0096652 A1 | 4/2010 | Choi et al. | 257/98 |
| 2011/0140078 A1 * | 6/2011 | Hsu | 257/13 |
| 2011/0180831 A1 | 7/2011 | Song | 257/98 |
| 2011/0204390 A1 * | 8/2011 | Lerman et al. | 257/88 |
| 2012/0007120 A1 | 1/2012 | Kim et al. | 257/98 |
| 2012/0025222 A1 * | 2/2012 | Chen et al. | 257/88 |
| 2012/0032218 A1 | 2/2012 | Choi et al. | 257/98 |
| 2012/0119249 A1 | 5/2012 | Kim et al. | 257/99 |
| 2012/0181568 A1 * | 7/2012 | Hsia et al. | 257/99 |
| 2012/0313122 A1 * | 12/2012 | Nakayama et al. | 257/88 |

FOREIGN PATENT DOCUMENTS

| | | | |
|---|---|---|---|
| KR | 10-2007-0079956 | 8/2007 | ............ H01L 33/36 |
| KR | 10-2010-0044726 | 4/2010 | ............ H01L 33/32 |
| KR | 10-2011-0082863 | 7/2011 | ............ H01L 33/02 |

* cited by examiner

Prior Art

Prior Art

Prior Art

SEMICONDUCTOR LIGHT-EMITTING DEVICE

CROSS-REFERENCE TO RELATED APPLICATIONS

This application is a national phase application of PCT Application No. PCT/KR2013/006742, filed on 26 Jul. 2013, which claims the benefit and priority to Korean Patent Application No. 10-2012-0081785, filed 26 Jul. 2012, to Korean Patent Application No. 10-2012-0081788, filed 26 Jul. 2012 and to Korean Patent Application No. 10-2012-0098199, filed 5 Sep. 2012. The entire disclosures of the applications identified in this paragraph are incorporated herein by references.

TECHNICAL FIELD

The present disclosure relates generally to a semiconductor light emitting device, and more specifically to a semiconductor light emitting device having a bonded layer-removed surface and/or an electrical pass on the supporting substrate.

Within the context herein, the term "semiconductor light emitting device" is intended to refer to a semiconductor optical device that generates light via electron-hole recombination, and the typical example thereof is a Group III-nitride semiconductor light emitting device. The Group III-nitride semiconductor is composed of Al(x)Ga(y)In(1-x-y)N (wherein, 0=x=1, 0=y=1, 0=x+y=1). Another example thereof is a GaAs-based semiconductor light emitting device used for red light emission.

BACKGROUND

This section provides background information related to the present disclosure which is not necessarily prior art.

FIG. 1 is a view illustrating one example of the semiconductor light emitting device (Lateral Chip) in the prior art, in which the semiconductor light emitting device includes a substrate 100, and a buffer layer 200, a first semiconductor layer 300 having a first conductivity, an active layer 400 for generating light via electron-hole recombination and a second semiconductor layer 500 having a second conductivity different from the first conductivity, which are deposited over the substrate 100 in the order mentioned, and additionally, a light-transmitting conductive film 600 for current spreading, and an electrode 700 serving as a bonding pad are formed thereon, and an electrode 800 serving as a bonding pad are formed on an etch-exposed portion of the first semiconductor layer 300.

FIG. 2 is a view illustrating another example of the semiconductor light emitting device (Flip Chip) in the prior art, in which the semiconductor light emitting device includes a substrate 100, and a first semiconductor layer 300 having a first conductivity, an active layer 400 for generating light via electron-hole recombination and a second semiconductor layer 500 having a second conductivity different from the first conductivity, which are deposited over the substrate 100 in the order mentioned, and additionally, three-layered electrode films for reflecting light towards the substrate 100, i.e., an electrode film 901, an electrode film 902 and an electrode film 903 are formed thereon, and an electrode 800 serving as a bonding pad is formed on an etch-exposed portion of the first semiconductor layer 300.

FIG. 3 is a view illustrating yet another example of the semiconductor light emitting device (Vertical Chip) in the prior art, in which the semiconductor light emitting device includes a first semiconductor layer 300 having a first conductivity, an active layer 400 for generating light via electron-hole recombination and a second semiconductor layer 500 having a second conductivity different from the first conductivity, which are deposited in the order mentioned, and additionally, a metal reflective film 910 for reflecting light towards the first semiconductor layer 300 is formed on the second semiconductor layer 500, and an electrode 940 is formed on the side of a supporting substrate 930. The metal reflective film 910 and the supporting substrate 930 are joined together by a wafer bonding layer 920. An electrode 800 serving as a bonding pad is formed on the first semiconductor layer 300.

FIG. 4 and FIG. 5 illustrate yet further examples of the semiconductor light emitting device in the prior art. As illustrated in FIG. 4, a semiconductor light emitting device (Flip Chip) as shown in FIG. 2 is mounted on a wiring board (1000), and then a substrate 100 is removed as shown in FIG. 5, thereby obtaining a semiconductor light emitting device (Vertical Chip; it is termed such to indicate the substrate 100 has been removed). In particular, this semiconductor light emitting device can be obtained by aligning electrode films 901, 902 and 903 and an electrode pattern 1010, followed by aligning an electrode 800 and an electrode pattern 1020. A semiconductor light emitting device is then mounted on the wiring board 1000, using a stud bump, paste or eutectic metals 950 and 960, and the substrate 100 is removed by means of a laser.

However, because the above process needs to be performed at the chip level, the process gets lengthy and complicated, and the alignment of the electrode films 901, 902 and 903, the electrode 800, and the electrode patterns 1010 and 1020 also creates difficulties. Apart from that, an increase in costs associated with the phosphor coating at the chip level adds another problem.

Therefore, while the commercialization of TFFC (Thin Film Flip Chip) technology at the chip level represents a high level manufacturing technology of semiconductor light emitting devices, on the other hand, it also openly manifests that the application of such technology at the wafer level is not yet made easy. Many suggestions have been made in order to apply this concept at the wafer level. Nevertheless, neither a semiconductor light emitting device nor a method for manufacturing the same was proposed, which can substantially overcome the difficulties in the alignment of electrode films 901, 902 and 903, the electrode 800 and the electrode patterns 1010 and 1020 and, after a wafer level bonding operation, the cracks in the semiconductor layers 200, 300 and 400 during the removal of the substrate 100 and in the subsequent processes.

FIG. 22 is a view illustrating yet further example of the semiconductor light emitting device in the art, in which the semiconductor light emitting device includes two semiconductor stacks A and B formed on a single growth substrate 100, each semiconductor stack A and B comprising a first semiconductor layer 300 having a first conductivity, an active layer 400 for generating light via electron-hole recombination and a second semiconductor layer 500 having a second conductivity different from the first conductivity, which are deposited in the order mentioned. Additionally, an electrode 700 serving as a bonding pad or a reflective film is formed, and an electrode 800 serving as a bonding pad is formed on an etch-exposed portion of the first semiconductor layer 300. The electrode 700 of the semiconductor stack A and the electrode 800 of the semiconductor stack B are connected through an electrical connection 780 such that the semiconductor stack A and the semiconductor B are also electrically connected.

Technical Problem

The problems to be solved by the present disclosure will be described in the latter part of the best mode for carrying out the invention.

Technical Solution

The problems to be solved by the present disclosure will be described in the latter part of the best mode for carrying out the invention.

According to one aspect of the present disclosure, there is provided a semiconductor light emitting device comprising: a supporting substrate having a first surface and a second surface opposite to the first surface; at least one semiconductor stack formed on the first surface, wherein each stack includes a plurality of semiconductor layers grown sequentially using a growth substrate and composed of a first semiconductor layer having a first conductivity, a second semiconductor layer having a second conductivity different from the first conductivity, and an active layer interposed between the first semiconductor layer and the second semiconductor layer and generating light via electron-hole recombination, and wherein a growth substrate-removed surface is formed on the side of the first semiconductor layer; a bonded layer, which bonds the second semiconductor layer side of the plurality of semiconductor layers to the first surface side of the supporting substrate; and a bonded layer-removed surface formed on the first surface, being open towards the plurality of semiconductor layer to supply current thereto. The bonded layer-removed surface combined with an electrical connection extended to the plurality of semiconductor layers, a wire and an electrical pass penetrating the supporting substrate may allow the manufacture of a variety of semiconductor light emitting devices.

Advantageous Effects

The advantageous effects of the present disclosure will be described in the latter part of the best mode for carrying out the invention.

DETAILED DESCRIPTION

Hereinafter, the present disclosure will now be described in detail with reference to the accompanying drawings.

Figure 1:
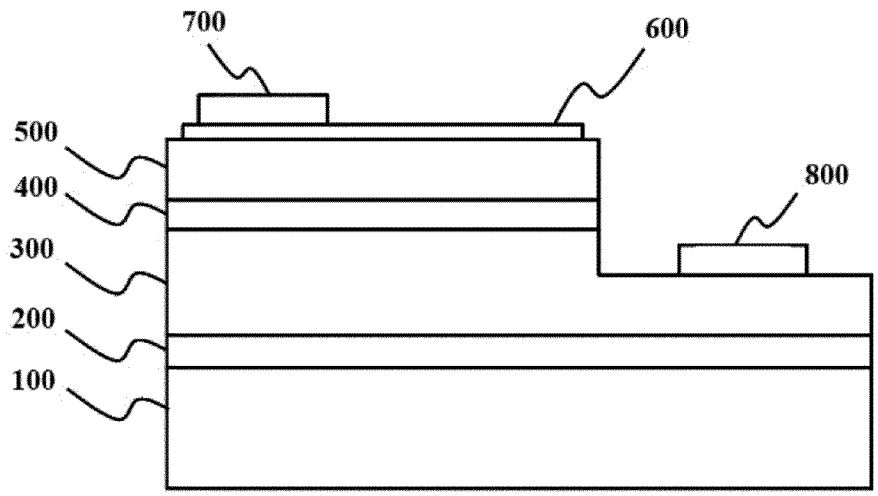
FIG. 1 is a view illustrating one example of a semiconductor light emitting device (Lateral Chip) in the prior art.
Figure 2:
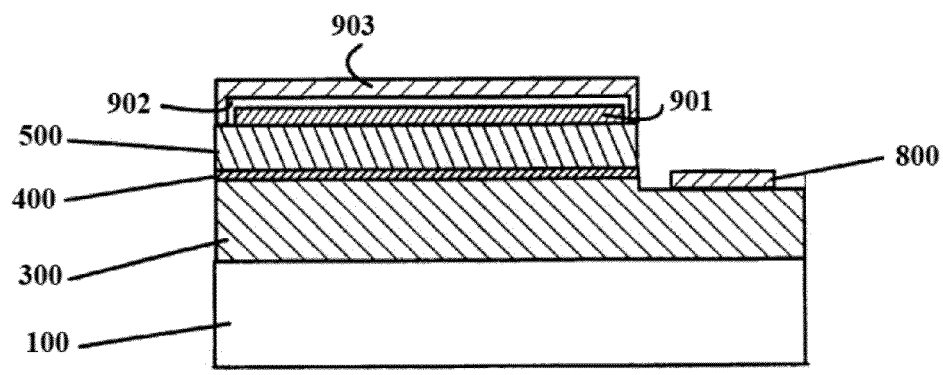
FIG. 2 is a view illustrating another example of a semiconductor light emitting device (Flip Chip) in the prior art.
Figure 3:
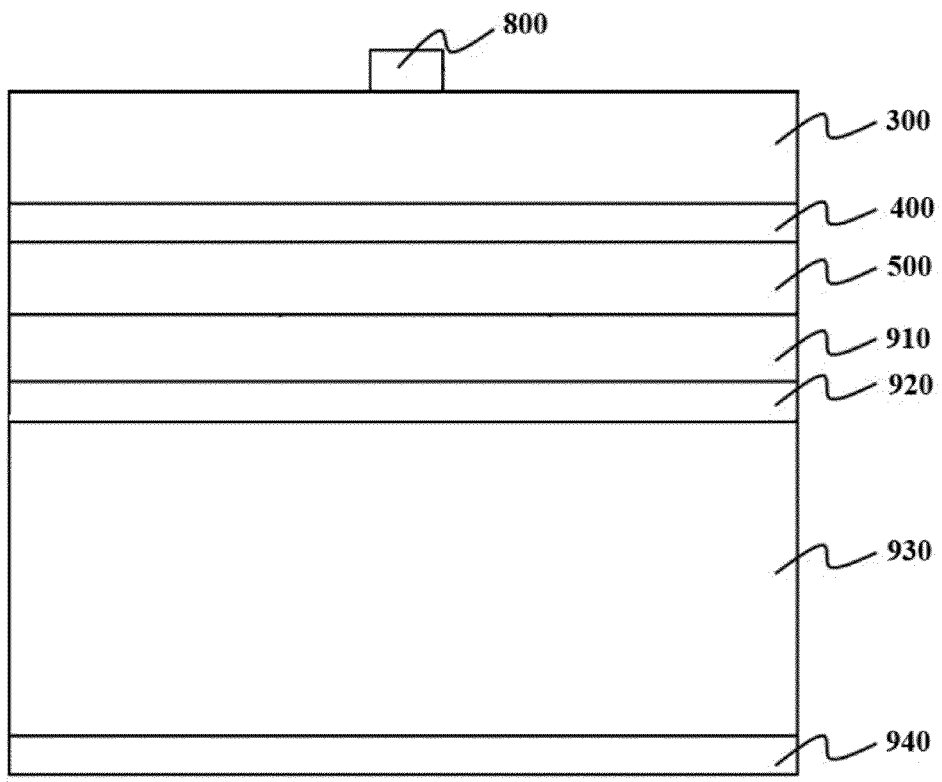
FIG. 3 is a view illustrating yet another example of a semiconductor light emitting device (Vertical Chip) in the prior art.
Figure 4:
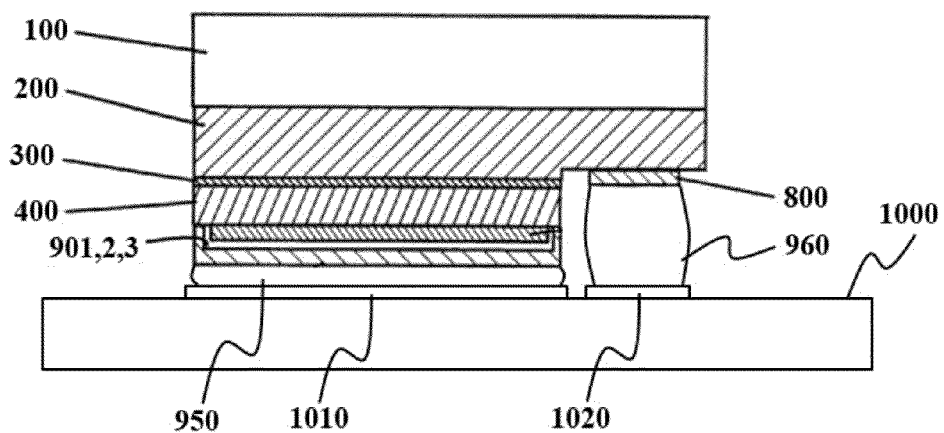
FIG. 4 and FIG. 5 are views illustrating yet further examples of a semiconductor light emitting device in the prior art.
Figure 5:
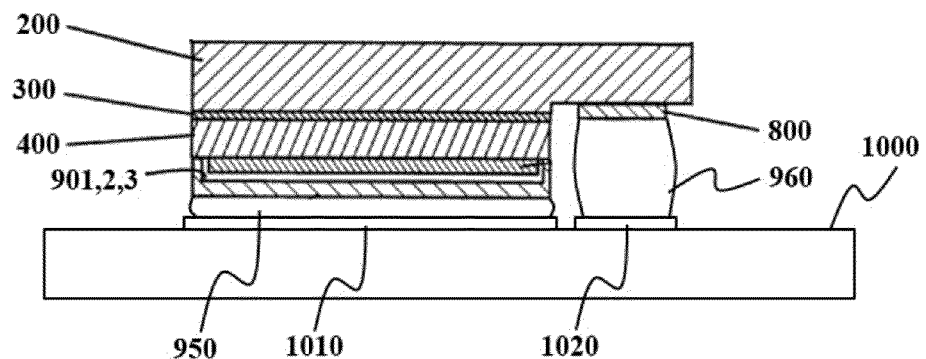
Figure 6:
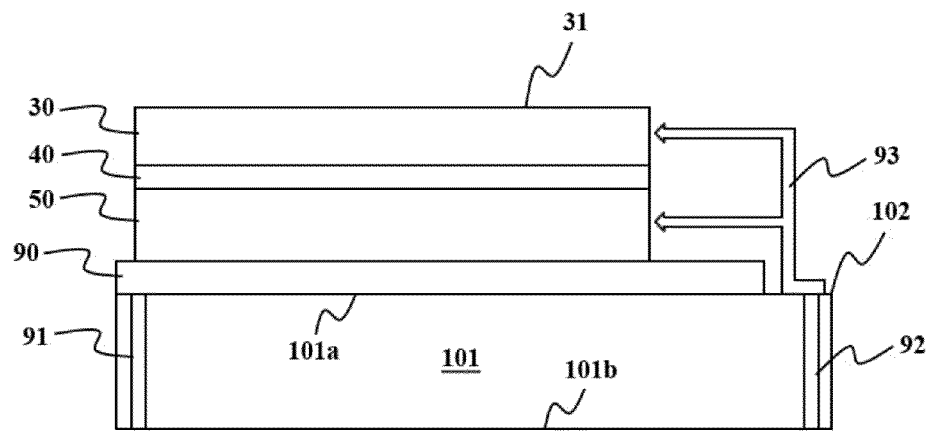
FIG. 6 is a view describing the technical concept of a semiconductor light emitting device according to the present disclosure.

FIG. 6 is a view describing the technical concept of a semiconductor light emitting device according to the present disclosure, in which the semiconductor light emitting device has a plurality of semiconductor layers which includes a first semiconductor layer 30 (e.g. n-type GaN) having a first conductivity, a second semiconductor layer 50 (e.g. p-type GaN) having a second conductivity different from the first conductivity, and an active layer 40 (e.g. InGaN/GaN multi-quantum well structure) interposed between the first semiconductor layer 30 and the second semiconductor layer 50, generating light via electron-hole recombination. The conductivity of the first semiconductor layer 30 and the conductivity of the second semiconductor layer 50 may be changed. The plurality of semiconductor layers 30, 40 and 50 has a growth substrate-removed surface 31 that is exposed by the removal of the growth substrate 10 (see FIG. 7). The growth substrate-removed surface 31 can be comprised of a doped n layer, an undoped n layer or a buffer layer 200 as in FIG. 1, depending on the conditions for the removal of the growth substrate and the sacrificial layer. It can also be a rough surface in order to increase the light extraction efficiency. Further, the semiconductor light emitting device has a supporting substrate 101 with a first surface 101a and a second surface 101b opposite to the first surface 101a. The supporting substrate 101 has a first electrical pass 91 and a second electrical pass 92. In FIG. 6, the first electrical pass 91 and the second electrical pass 92 continue from the second surface 101a to the first surface 101b. The plurality of semiconductor layers 30, 40 and 50 and the supporting substrate 101 are joined or bonded by a bonded layer 90. The bonded layer 90 can be formed by a conventional wafer bonding method that is employed in the manufacture of the semiconductor light emitting device as in FIG. 3. The first electrical pass 91 transfers either electrons or holes to the plurality of semiconductor layers 30, 40 and 50, via the bonded layer 90. By removing the bonded layer 90, the second electrical pass 92 is exposed on the first surface 101a. With the bonded layer 90 being removed, the second electrical pass 92 is open towards the plurality of the semiconductor layers 30, 40 and 50. This open, exposed area of the first surface 101a is defined as a bonded layer-removed surface 102. an electrical connection 93 can electrically connect the second electrical pass 92 to the first semiconductor layer 30 or to the second semiconductor layer 50.

Figure 7:
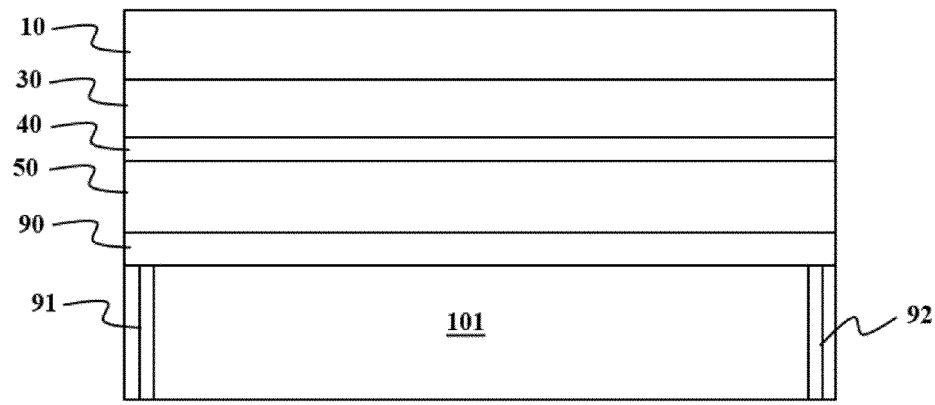
FIG. 7 through FIG. 11 views illustrating one example of the method for manufacturing a semiconductor light emitting device according to the present disclosure.
Figure 8:
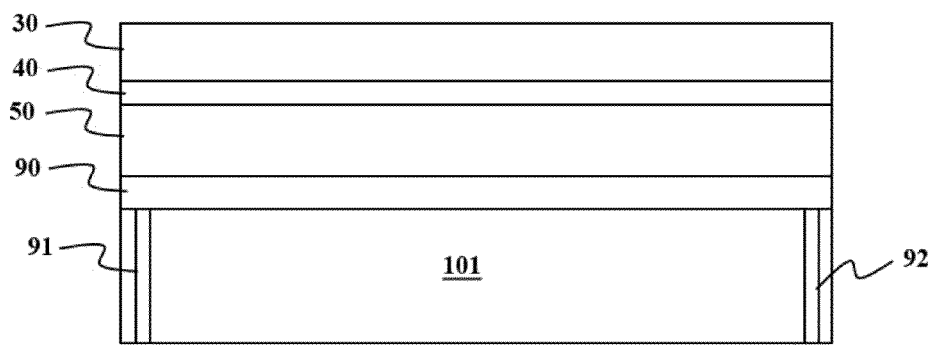
Figure 9:
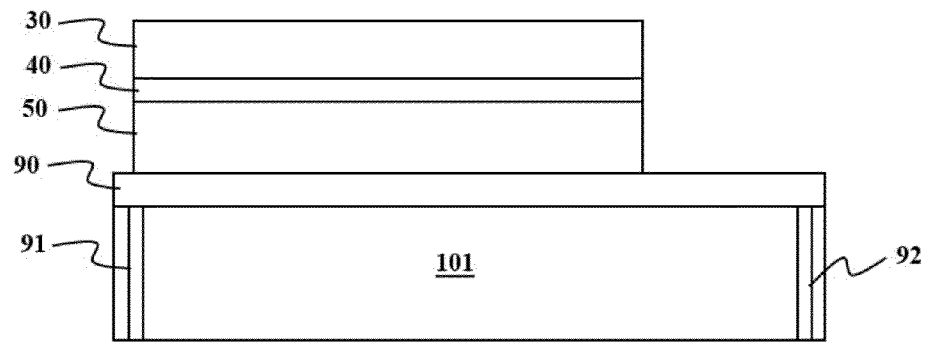
Figure 10:
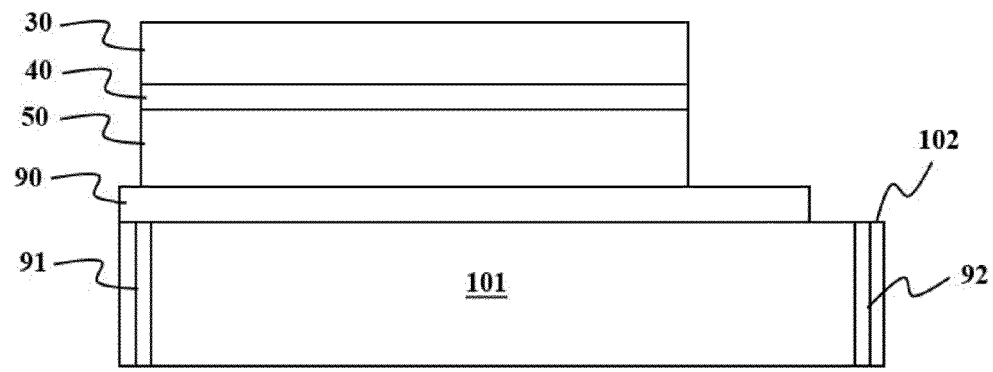
Figure 11:
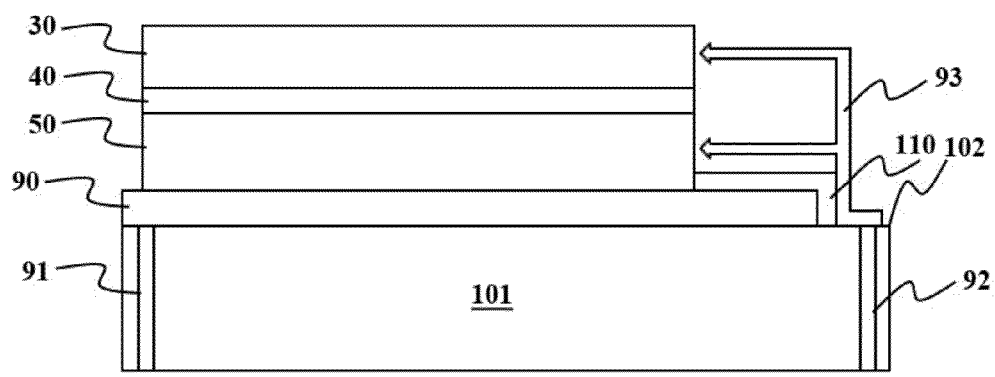

FIG. 7 through FIG. 11 views illustrating one example of the method for manufacturing a semiconductor light emitting device according to the present disclosure. Referring now to FIG. 7, a first semiconductor layer 30, an active layer 40 and a second semiconductor layer 40 that are sequentially grown on a growth substrate 10 (e.g. a sapphire substrate) are first bonded, via a bonded layer 90 having been formed, to a supporting substrate 101 where a first electrical pass 91 and a second electrical pass 92 are provided. Exemplary materials of the growth substrate 10 may include Si, AlN, AlGaN, SiC and so on, but are not limited thereto. As for the supporting substrate 101, any material that prevents the plurality of semiconductor layers 30, 40 and 50 from cracking during the removal of the growth substrate and that demonstrates superior heat dissipation performances is suitable, and examples thereof may include SiC, AlSiC, AlN, AlGaN, GaN, sapphire, LTCC (Low Temperature Co-fired Ceramic), HTCC (High Temperature Co-fired Ceramic) and so on. It is preferable to have a buffer layer 200 as in FIG. 1, during the growth of the plurality of semiconductor layers 30, 40 and 50. Next, referring to FIG. 8, the growth substrate 10 is separated and removed from the plurality of semiconductor layers 30, 40 and 50. This removal of the growth substrate 10 can be achieved by laser lift-off, wet etching using a sacrificial layer, grinding, CMP (Chemical-Mechanical Polishing) or the like. Next, referring to FIG. 9, in a wafer level state (This wafer level should be understood as a relative concept to the chip level. Normally, the wafer level indicates a state where the plurality of semiconductor layers 30, 40 and 50 is stacked on the growth substrate 10. However, one should understand that it also includes a state of the plurality semiconductor layers 30, 40 and 50 on the growth substrate 10 cut in a bulk larger than the chip level, prior to the chip level, i.e. before becoming a chip cut into a shape that is practically used), before being divided into individual chips, the plurality of semiconductor layers 30, 40 and 50 is partly removed and isolated. After this, as shown in FIG. 10, a bonded layer 90 is removed to form a bonded layer-removed surface 102, and the second electrical pass 92 is then exposed. The removal of the bonded layer 90 can be achieved by a well-known dry etching or wet etching process. It is not always required that the removal of the bonded layer 90 should follow the isolation of the plurality of semiconductor layers 30, 40 and 50 into individual chips. For instance, in order to form the bonded layer 90, first, the plurality of semiconductor layers 30, 40 and 50 and the bonded layer 90 may be removed such that a bonded layer-removed surface 102 is formed, and thereafter the plurality of semiconductor layers 30, 40 and 50 can be isolated for individual chips. Referring next to FIG. 11, if necessary, an insulating layer 110 (e.g. $SiO_2$) is provided, and an electrical connection 93 is formed. The electrical connection 93 can be formed by depositing any metal(s) used in a wide variety of semiconductor processes. The bonded layer 90 may be formed by providing a bonding material to the plurality of semiconductor layers 30, 40 and 50 as well as to the supporting substrate 101, or by providing a bonding material to either side. The supporting substrate 101 is perforated and a conductive material is inserted therein, such that the first electrical pass 91 and the second electrical pass 92 are formed. This can be done by electroplating. The first electrical pass 91 and the second electrical pass 92 may continue to the second surface 101b (see FIG. 6) from the first, or they may be exposed as the second surface 101b is grinded.

Figure 12:
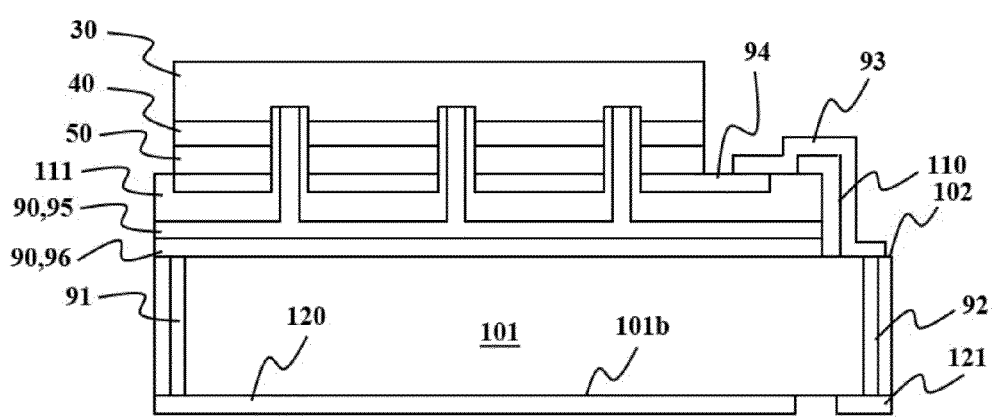
FIG. 12 is a view illustrating one example of the process of forming an electrical connection according to the present disclosure.

FIG. 12 is a view illustrating one example of the process of forming an electrical connection according to the present disclosure. Here, a first electrical connection 91 is electrically connected to a first semiconductor layer 30 via a bonded layer 90 such that electrons are transferred to an active layer 40 via the first semiconductor layer 30. A second electrical connection 92 is electrically connected, through an electrical connection 93, to a second semiconductor layer 40 via a first conductive layer 94 such that holes are transferred to the active layer 40 via the second semiconductor layer 50.

As the plurality of semiconductor layers 30, 40 and 50 is removed, the first conductive layer 94 is exposed and electrically connected with the electrical connection 93. The first conductive layer 94 preferably consists of a material which not only spreads current into the second semiconductor layer 50 but also reflects light generated in the active layer 40 towards the first semiconductor layer 30. The first conductive layer 94 can be formed of Au, Pt, Ag, Al, Rh, Cr, Cu, Ta, Ni, Pd, Mg, Ru, Ir, Ti, V, Mo, W, TiW, CuW, ITO, ZnO, SnO2, In$_2$O$_3$, or an alloy thereof, in a multi-layer (e.g. at least two layer) configuration.

The electrical connection 93 can be formed of Au, Pt, Ag, Al, Rh, Cr, Cu, Ta, Ni, Pd, Mg, Ru, Ir, Ti, V, Mo, W, TiW, CuW or an alloy thereof, in a multi-layer (e.g. at least two layer) configuration.

The bonded layer 90 includes a conductive bonded layer 96 provided onto a supporting substrate 101, and a second conductive layer 95 provided on the side of the plurality of semiconductor layer 30, 40 and 50 and continuing to the first semiconductor layer 30 passing through the second semiconductor layer 50 and the active layer 30. The conductive bonded layer 95 may be comprised of a single material, or have another suitable material for bonding on the side abutting against the conductive bonded layer 96.

The conductive bonded layer 95 may be composed of any material(s) forming Ohmic contact with GaN materials and any material(s) serving as a bond, and can be formed of Au, Pt, Ag, Al, Rh, Cu, Ta, Ni, Pd, Ti, V, Mo, W, TiW, CuW, Sn, In, Bi, or an alloy thereof, in a multi-layer (e.g. at least two layer) configuration.

The conductive bonded layer 96 may be composed of any material(s) of excellent adhesion with the supporting substrate and any material(s) serving as a bond, and can be formed of Ti, Ni, W, Cu, Ta, V, TiW, CuW, Au, Pd, Sn, In, Bi, or an alloy thereof, in a multi-layer (e.g. at least two layer) configuration.

Reference numeral 110 and 111 denote insulating layers.

With the above configuration, the entire surfaces of the plurality of semiconductor layers 30, 40 and 50 and the entire surface of the supporting substrate 101 are used for bonding, and these entire surfaces remain in the bonded state even during the removal of the growth substrate 10 (see FIG. 7), such that the plurality of semiconductor layer 30, 40 and 50 can be prevented from cracking. Moreover, the alignment between the first electrical pass 91 and the second electrical pass 92, and the plurality of semiconductor layers 30, 40 and 50 can be carried out without difficulties. Nevertheless, after the growth substrate 10 is removed, an electrical connection between the second electrical pass 92 and the plurality of semiconductor layers 30, 40 and 50 is required. For this, the bonded layer 90 having already been bonded is removed to form a bonded layer-removed surface 102, and the second electrical pass 92 and the second semiconductor layer 50 are electrically connected using the electrical connection 93. A person skilled in the art should consider that, apart from the present disclosure, it is also possible to form small holes in the second conductive layer 95 or in the conductive bonded layer 96, prior to the formation of the bonded layer 90. Preferably, a rear electrode 120 and a rear electrode 121 are provided onto the second surface 101b of the supporting substrate 101 and connected with the first electrical pass 91 and the second electrical pass 92, such that they can serve as lead frames.

Figure 13:
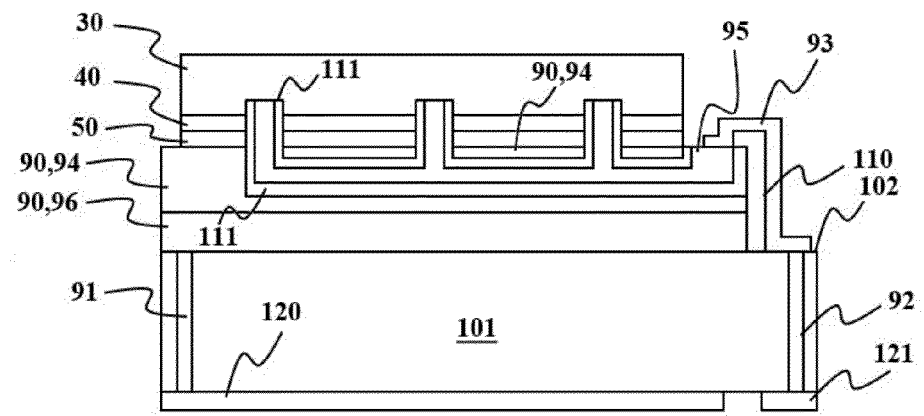
FIG. 13 is a view illustrating another example of the process of forming an electrical connection according to the present disclosure.

FIG. 13 is a view illustrating another example of the process of forming an electrical connection according to the present disclosure. Here, a first conductive layer 94 and a conductive bonded layer 96 are bonded to form a bonded layer 90, and a second conductive layer 95 and an electrical connection 93 are connected, whereby current is supplied from the second electrical pass 92 to a first semiconductor layer 30.

Figure 14:
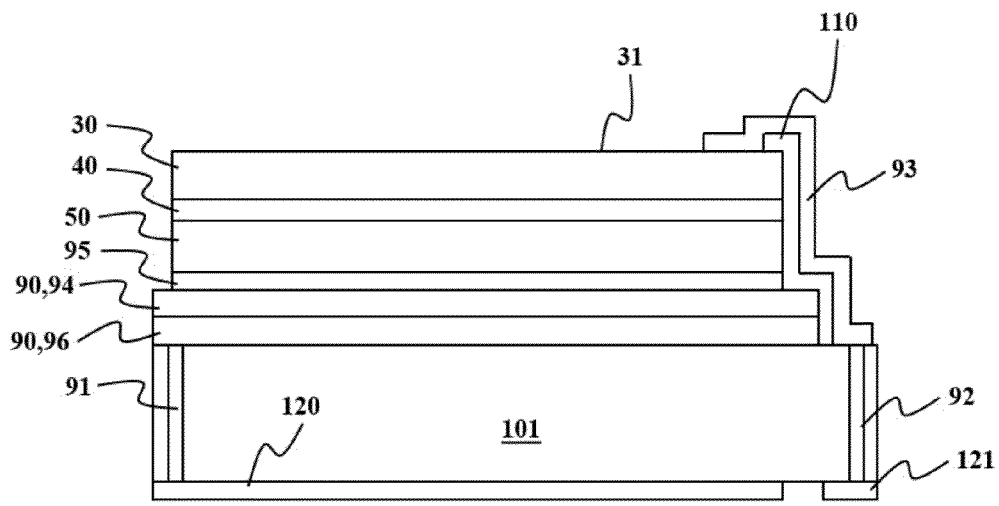
FIG. 14 is a view illustrating yet another example of the process of forming an electrical connection according to the present disclosure.

FIG. 14 is a view illustrating yet another example of the process of forming an electrical connection according to the present disclosure. Here, a conductive bonded layer 96 and a second conductive layer 94 are bonded to form a bonded layer 90. However, only the second conductive layer 94 is involved with bonding, and no current is supplied to a first semiconductor layer 30. A first electric pass 91 is electrically connected with a second semiconductor layer 50, via the bonded layer 90 and a first conductive layer 95. Here, the first conductive layer 95 can serve as a reflective film and/or current spreading layer. The current supply to the first semiconductor layer 30 can be achieved by an electrical connection 93 continuing from a second electrical pass 92 to a growth substrate-removed surface 31.

Figure 15:
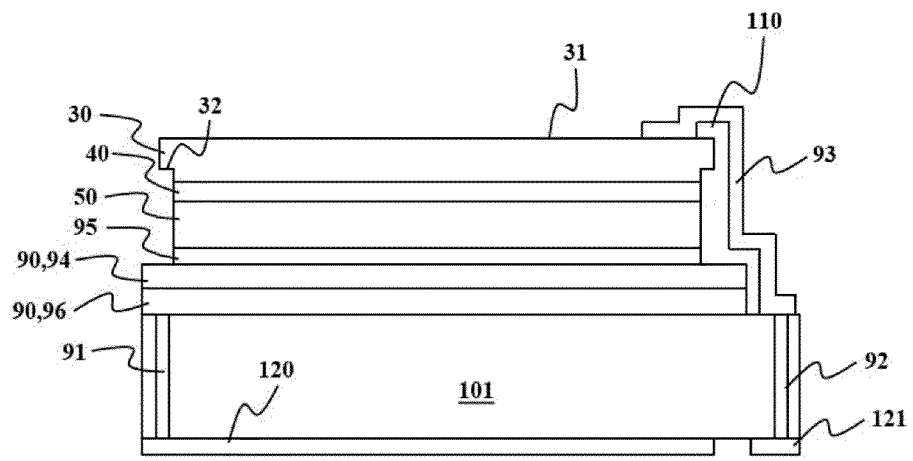
FIG. 15 is a view illustrating yet another example of the process of forming an electrical connection according to the present disclosure.

FIG. 15 is a view illustrating yet another example of the process of forming an electrical connection according to the present disclosure. Here, prior to bonding, a second semiconductor layer 50 and an active layer 40 are removed and thus a mesa surface 32 is formed on a first semiconductor layer 30 in the plurality of semiconductor layers 30, 40 and 50. Once the mesa surface 32 is formed, an isolation process can also be done on the plurality of semiconductor layers 30, 40 and 50 in advance. With this configuration, after the formation of the mesa surface 32, the active layer 40 may have a protective layer (e.g. SiO$_2$; it becomes a part of an insulating layer 110), which in turn would enhance the reliability of the device in the subsequence processes.

Figure 16:
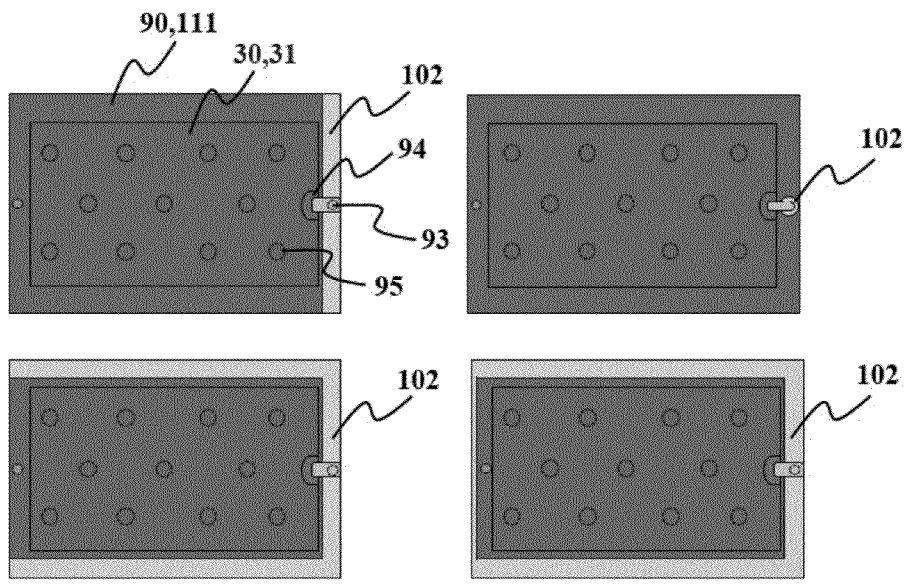
FIG. 16 is a view illustrating examples of the form of a growth substrate-removed surface in the semiconductor light emitting device shown in FIG. 12.

FIG. 16 is a view illustrating examples of the form of a growth substrate-removed surface in the semiconductor light emitting device shown in FIG. 12. The growth substrate-removed surface 102 can be formed on one side, two sides (not shown), three sides or the four sides of the semiconductor light emitting device, or can simply be an opening form. To avoid redundancy in explaining, like or similar elements designated by the same reference numerals will not be explained. The electrical connection 93 may be positioned in the growth substrate-removed surface 102, or on the interface separating a chip from another.

Figure 17:
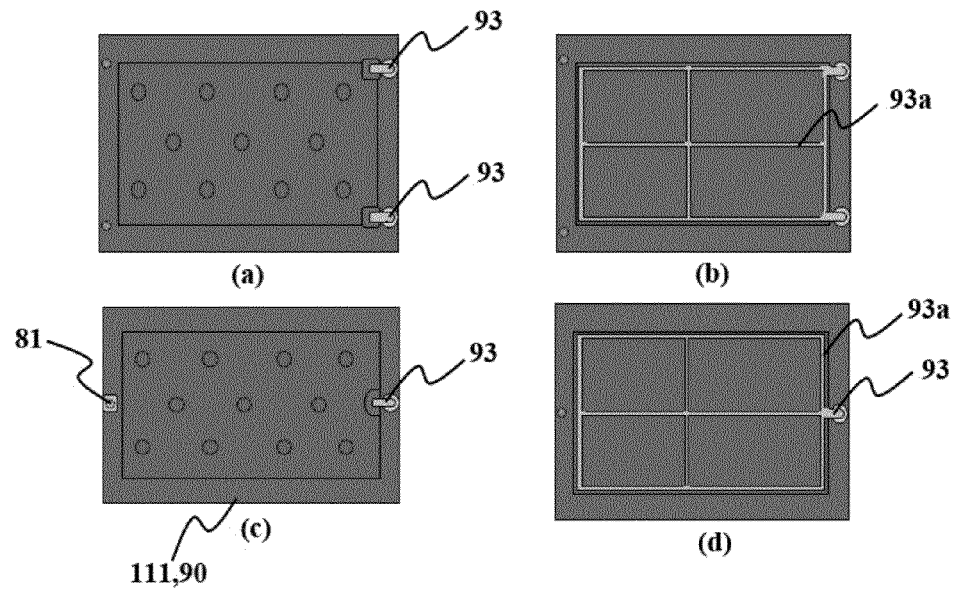
FIG. 17 is a view illustrating examples of the form of an electrical connection according to the present disclosure.

FIG. 17 is a view illustrating examples of the form of an electrical connection according to the present disclosure, in which (a) shows that two electrical connections 93 are formed, and (b) and (d) show that a finger electrode 93a is provided to the electrical connection 93. This configuration is applied to the semiconductor light emitting device shown in FIG. 14. In (c), an electric contact 81 is provided by removing an insulating layer 111 to expose a bonded layer 90. By employing the electric contact 81 and the electrical connection 93, probing and sorting can be facilitated during the manufacturing process of a device.

Figure 18:
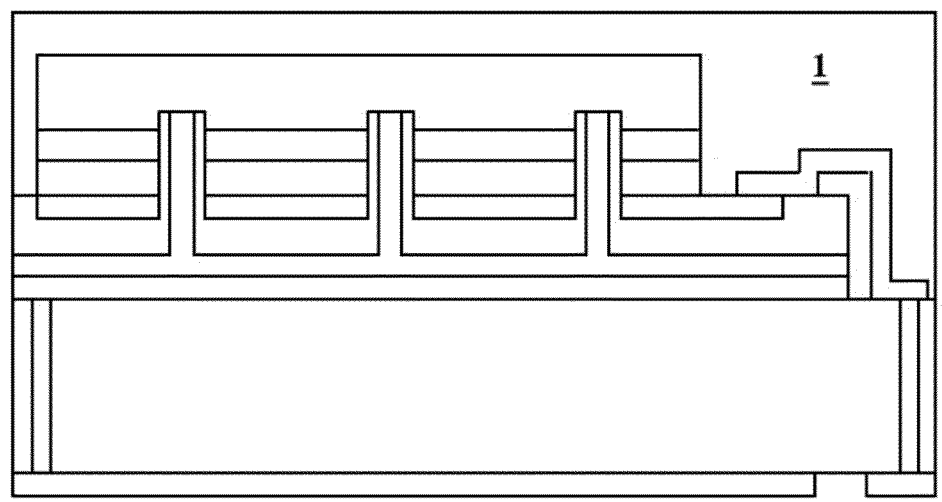
FIG. 18 through FIG. 20 are views illustrating examples of the application of a phosphor in the present disclosure.
Figure 19:
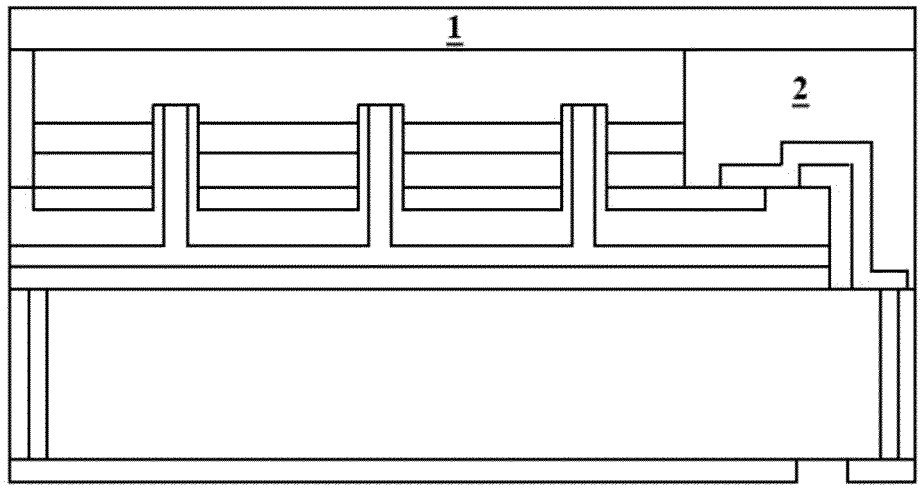
Figure 20:
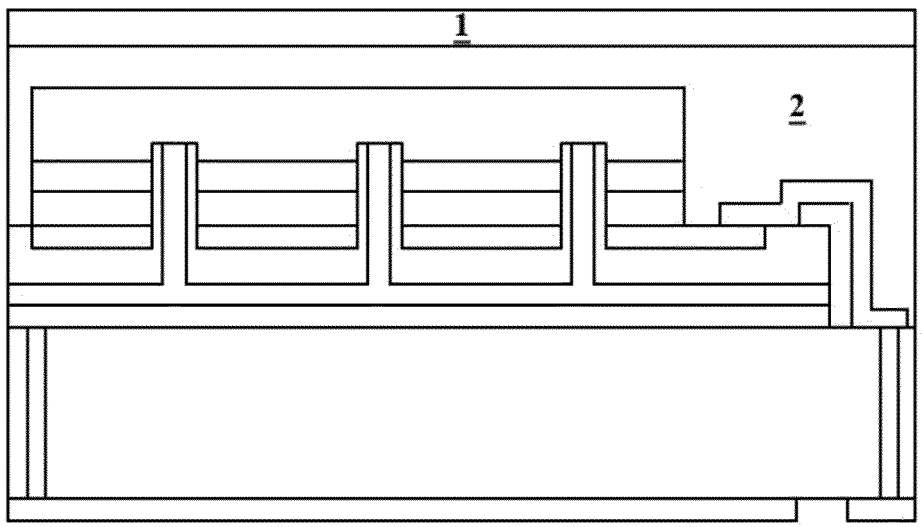

FIG. 18 through FIG. 20 are views illustrating examples of the application of a phosphor in the present disclosure. An encapsulant 1 containing phosphors can directly be applied as shown in FIG. 18; or an encapsulant 2 free of phosphors can be used, with the encapsulant 1 being provided only to the upper part of a semiconductor light emitting device, as shown in FIG. 19; or the encapsulant 2 free of phosphors can be used, with the encapsulant 1 being applied at a certain distance away from the semiconductor light emitting device, as shown in FIG. 20.

Figure 21:
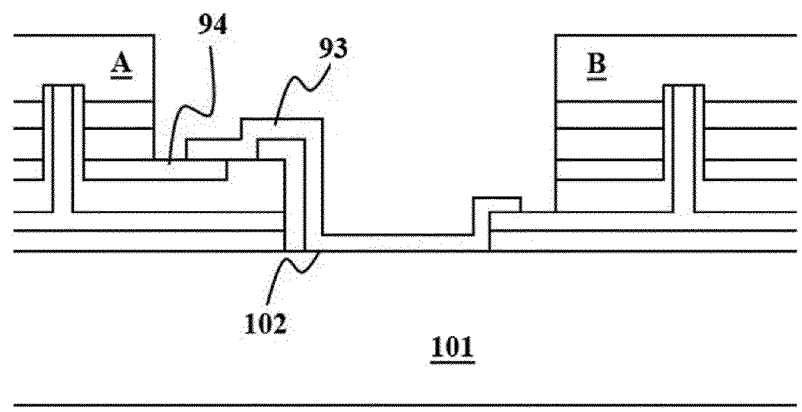
FIG. 21 is a view illustrating yet another example of the semiconductor light emitting device according to the present disclosure.
Figure 22:
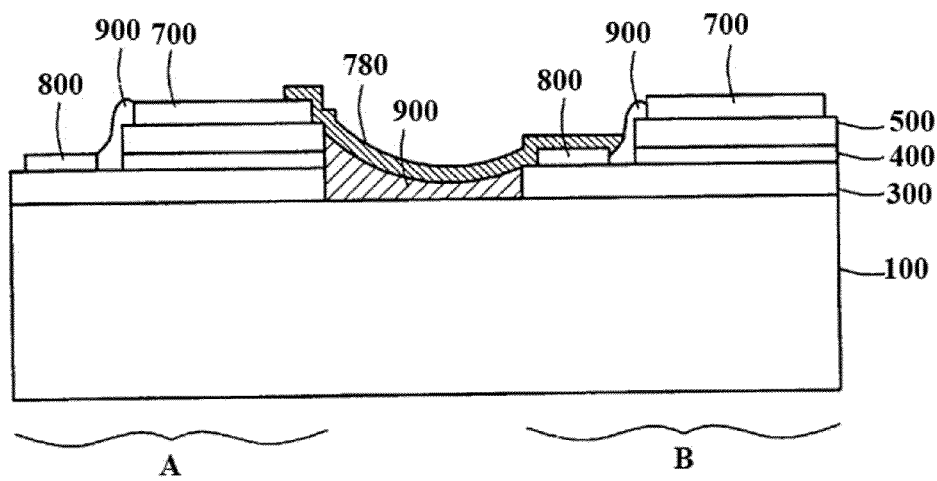
FIG. 22 is a view illustrating another example of the semiconductor light emitting device in the art.

FIG. 21 is a view illustrating yet another example of the semiconductor light emitting device according to the present disclosure. As can be seen, on a single supporting substrate 101, the second electrical pass 92 is removed, and the semiconductor light emitting device or the semiconductor stack A and the semiconductor light emitting device or the semiconductor stack B are connected through an electrical connection 93 on the bonded layer-removed surface 102.

Figure 23:
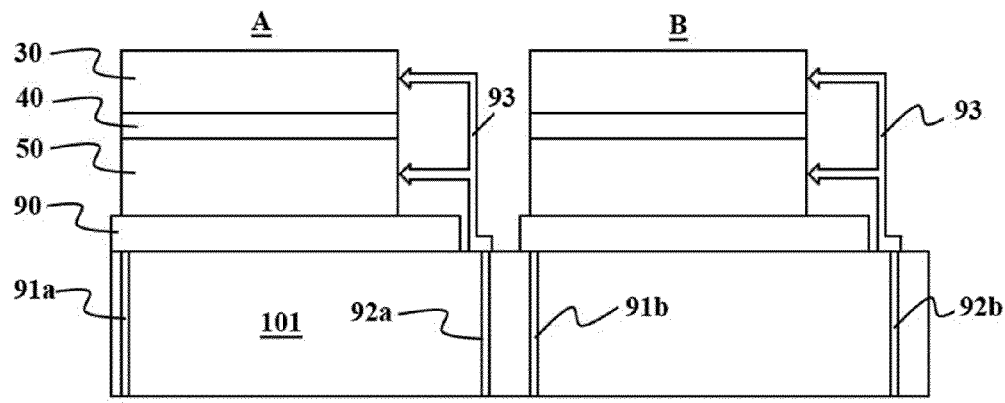
FIG. 23 is a view illustrating yet another example of the semiconductor light emitting device according to the present disclosure.

FIG. 23 is a view illustrating yet another example of the semiconductor light emitting device according to the present disclosure, in which one supporting substrate 101 is provided with two semiconductor stacks A and B. Each of the semiconductor stacks A and B has a first semiconductor layer 30, an active layer 40, and a second semiconductor layer 50 which is bonded to the supporting substrate 101 by means of a bonded layer 90. A first electrical pass 91a of the semiconductor stack A as well as a first electrical pass 91b of the semiconductor stack B are electrically connected with the bonded layer 90; a second electrical pass 92 of the semiconductor stack A and a second electrical pass 92b of the semiconductor stack B are electrically connected with the semiconductor stack A and the semiconductor stack B through electrical connections 93 and 93, respectively.

Figure 24:
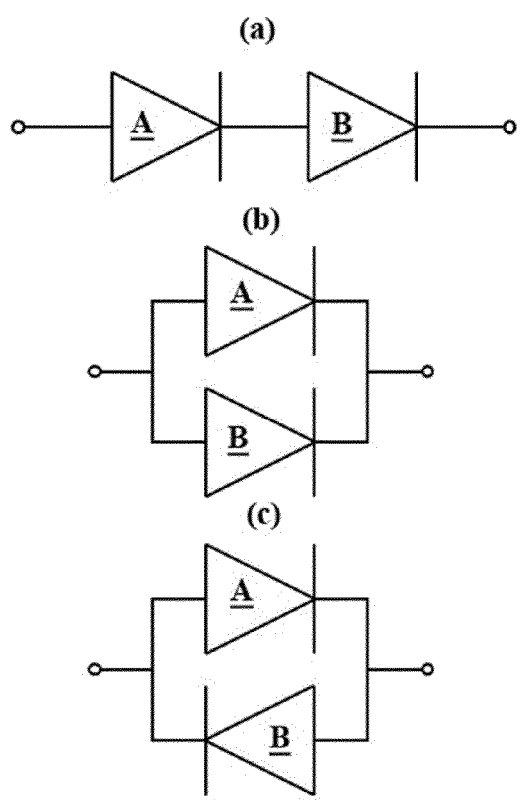
FIG. 24 illustrates examples of the electrical coupling relationships between the semiconductor stack A and the semiconductor stack B.

FIG. 24 illustrates examples of the electrical coupling relationships between the semiconductor stack A and the semiconductor stack B. More specifically, in (a), the semiconductor stack A and the semiconductor stack B are connected in series; in (b), the semiconductor stack A and the semiconductor stack B are connected in parallel; and in (c), the semiconductor stack A and the semiconductor stack B are connected in parallel in the reverse direction. The serial connection can be achieved, for example, by connecting the second electrical pass 92a with the first electrical pass 91b. The parallel connection can be achieved, for example, by connecting the first electrical pass 91a with the first electrical pass 91b, and by connecting the second electrical pass 92a with the second electrical pass 92b. The parallel connection in the reverse direction can be achieved by connecting the first electrical pass 91a with the second electrical pass 92b, and by connecting the second electrical pass 92a with the first electrical pass 91b.

Figure 25:
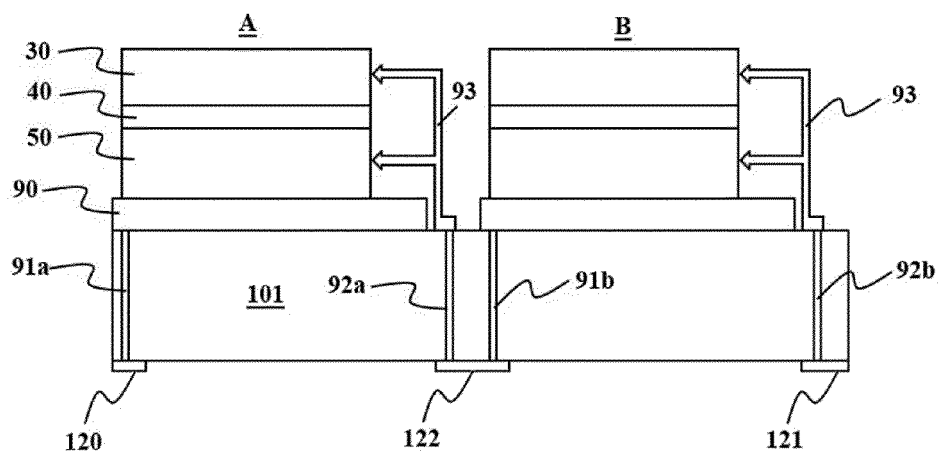
FIG. 25 is a view illustrating a practical example of the electrical connection between the semiconductor stack A and the semiconductor stack B.

FIG. 25 is a view illustrating a practical example of the electrical connection between the semiconductor stack A and the semiconductor stack B, in which the second electrical pass 92a of the semiconductor stack A and the first electrical pass 91b of the semiconductor stack B are connected in series through an electrical connection 122. Preferably, the first electrical pass 91a of the semiconductor stack A is provided with a rear electrode 120, and the second electrical pass 92b of the semiconductor stack B is provided with a rear electrode 121, respectively. In order to form the electrical connection 122, techniques, e.g. physical vapor deposition (PVD) including evaporator deposition, sputter deposition and pulse laser deposition (PLD), or electrochemical deposition can be applied.

Figure 26:
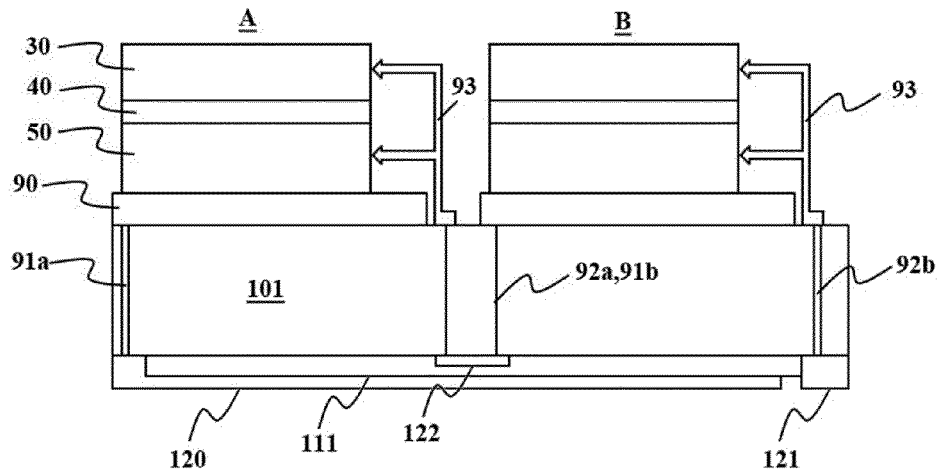
FIG. 26 is a view illustrating another practical example of the electrical connection between the semiconductor stack A and the semiconductor stack B.

FIG. 26 is a view illustrating another practical example of the electrical connection between the semiconductor stack A and the semiconductor stack B, in which the second electrical pass 92a of the semiconductor stack A and the first electrical pass 91b of the semiconductor stack B are integrated, and an electrical connection 122 is provided. This electrical connection 122 may be omitted. The electrical connection 122 is covered with an insulating layer 111, and a rear electrode 120 is formed thereon. It is also acceptable that the insulating layer 11 is covered up with the rear electrode 121. The rear electrode 120 having a larger width can be helpful for heat emission of the semiconductor light emitting device. The rear electrode 121 and the rear electrode 120 are designed to have the same height. However, it should be noted that the presence of these rear electrodes 120 and 121 and their shapes are not particularly limited, but their shapes can vary as needed for a given design.

Figure 27:
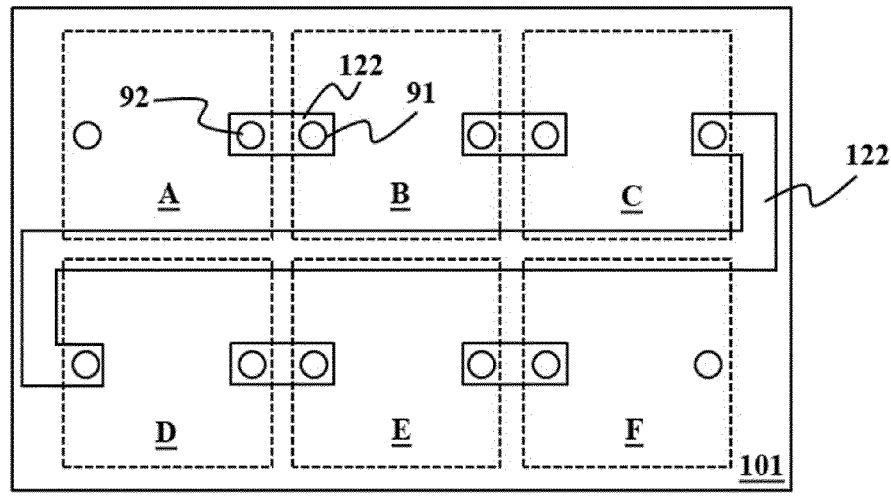
FIG. 27 through FIG. 31 illustrate examples of electrical coupling relationships between the semiconductor stack A and the semiconductor stack B shown in FIG. 23.
Figure 28:
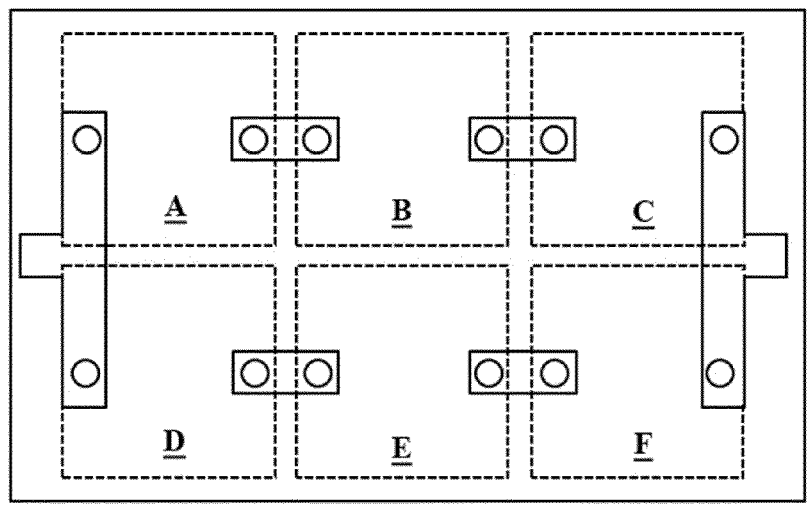
Figure 29:
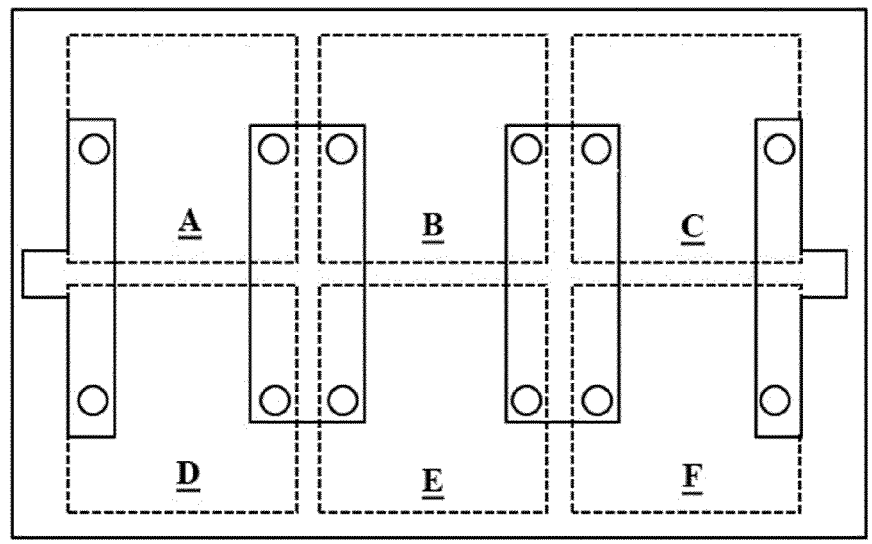
Figure 30:
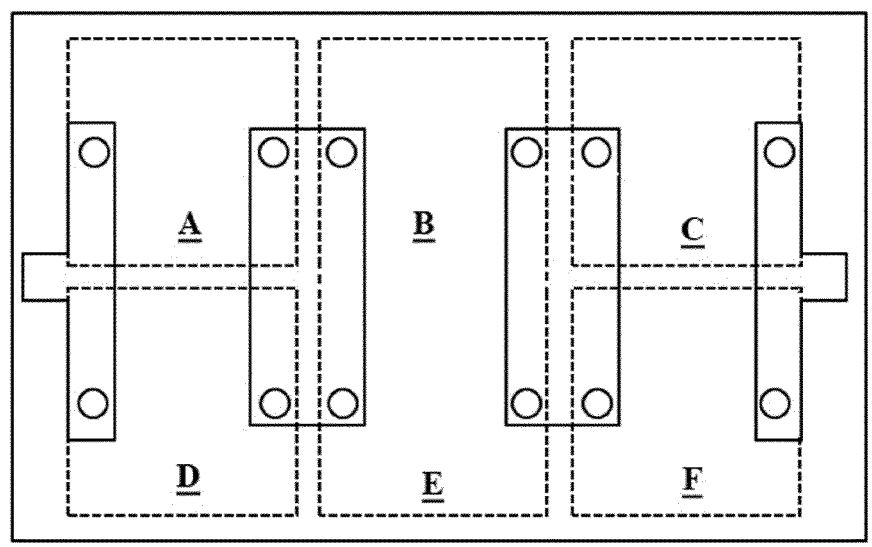
Figure 31:
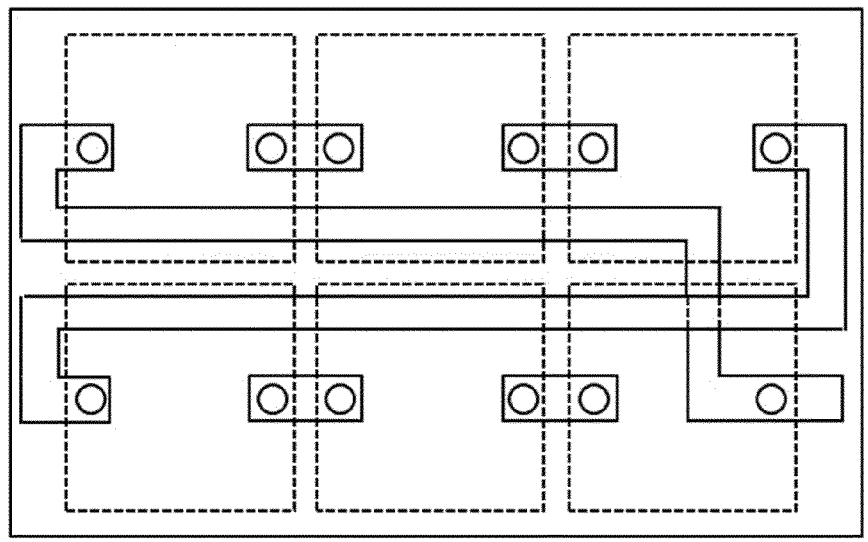

FIG. 27 through FIG. 31 illustrate examples of electrical coupling relationships between the semiconductor stack A and the semiconductor stack B shown in FIG. 23. Referring to FIG. 27, six semiconductor stacks A to F are connected in series on a single supporting substrate 101. This structure is made possible by connecting the second electrical pass 92a and the first electrical pass 91b of the respective semiconductor stacks, by the electrical pass 122. Referring to FIG. 28, semiconductor stacks A, B and C are connected in series, and semiconductor stacks D, E and F are connected in series, the semiconductor stacks A, B and C being connected with the semiconductor stacks D, E and F in parallel. Referring to FIG. 29, semiconductor stacks A and D are connected in parallel, semiconductor stacks B and E are connected in parallel, and semiconductor stacks C and F are connected in parallel, the semiconductor stacks A, B and C being connected with the semiconductor stacks D, E and F in series. FIG. 30 shows the same electrical connections as those in FIG. 29, except that the semiconductor stack B is integrated with the semiconductor stack E. Referring to FIG. 31, semiconductor stacks A, B and C are connected with semiconductor stacks D, E and F in parallel in the reverse direction. In addition, as the first electrical pass 91a is electrically connected with the second electrical pass 92b on the second surface 101b of the supporting substrate 101, different electrical configurations (e.g. a rectifier circuit-wheatstone bridge, Schottky-type AC LED array) can be formed using PN junction diodes.

Figure 32:
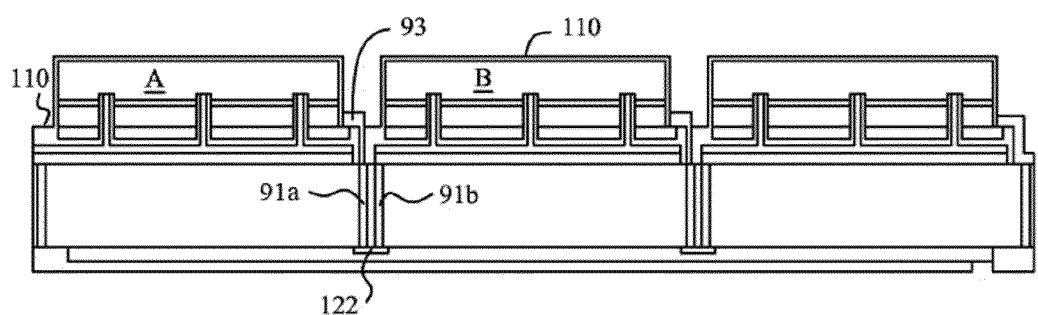
FIG. 32 is a view illustrating an example where the semiconductor light emitting device of FIG. 12 is applied to the electrical connection shown in FIG. 25.

FIG. 32 is a view illustrating an example where the semiconductor light emitting device of FIG. 12 is applied to the electrical connection shown in FIG. 25, in which the second electrical pass 92a of the semiconductor stack A is connected to the first electrical pass 91b of the semiconductor stack B through the electrical connection 122. The electrical connection 93 is connected with the second electrical pass 92a. In the figure, reference numeral 110 denotes an insulating layer.

Figure 33:
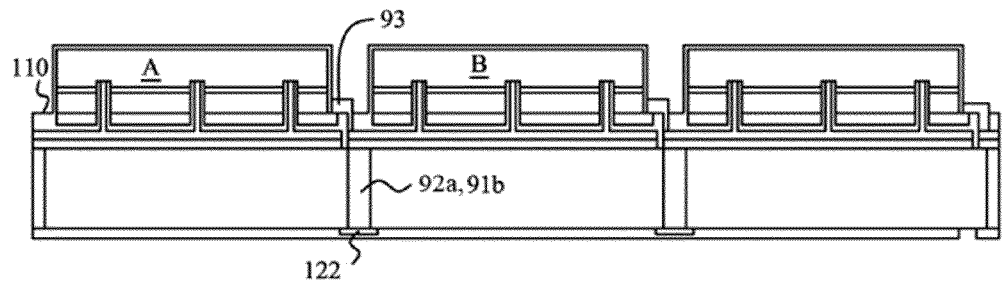
FIG. 33 is a view illustrating an example where the semiconductor light emitting device of FIG. 12 is applied to the electrical connection shown in FIG. 26.

FIG. 33 is a view illustrating an example where the semiconductor light emitting device of FIG. 12 is applied to the electrical connection shown in FIG. 26, in which the second electrical pass 92a of the semiconductor stack A is integrated with the first electrical pass 91b of the semiconductor stack B.

Figure 34:
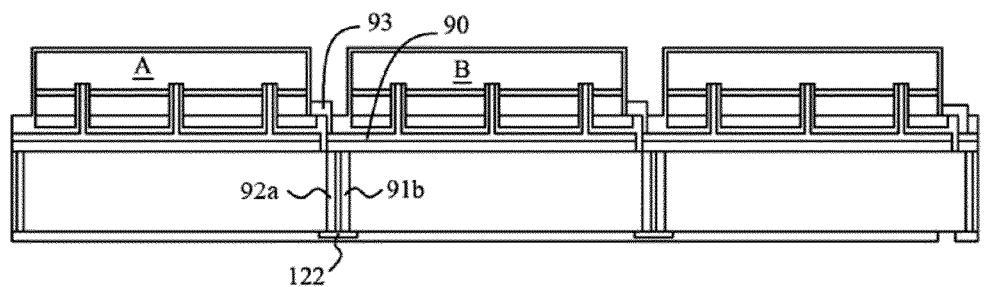
FIG. 34 is a view illustrating another example where the semiconductor light emitting device of FIG. 12 is applied to the electrical connection shown in FIG. 25.

FIG. 34 is a view illustrating another example where the semiconductor light emitting device of FIG. 12 is applied to the electrical connection shown in FIG. 25, in which the electrical connection 93, the second electrical pass 92a and the first electrical pass 91b are connected with the bonded layer 90 of the semiconductor stack B.

Figure 35:
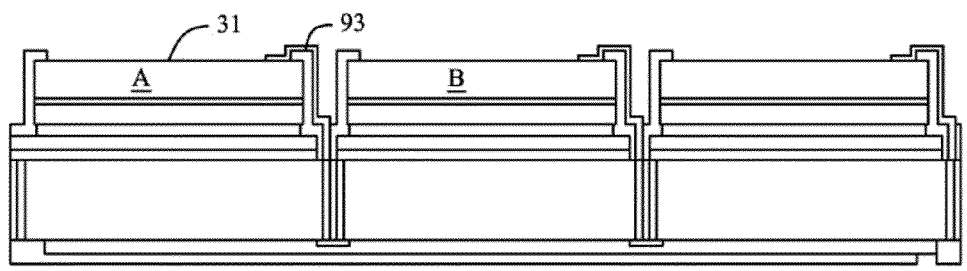
FIG. 35 is a view illustrating an example where the semiconductor light emitting device of FIG. 14 is applied to the electrical connection shown in FIG. 25.

FIG. 35 is a view illustrating an example where the semiconductor light emitting device of FIG. 14 is applied to the electrical connection shown in FIG. 25, in which the electrical connection 93 is same as that of FIG. 32, except that the electrical connection 93 continues to the growth substrate-removed layer 31. In addition, the electrical connections of the present disclosure can be applied to the semiconductor light emitting device of FIG. 13, as well as to various types of semiconductor light emitting devices.

Figure 36:
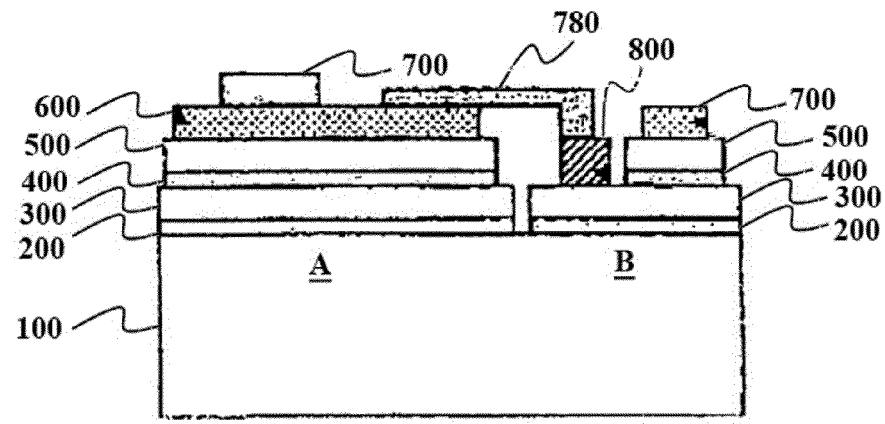
FIG. 36 is a view illustrating an example of the semiconductor light emitting device proposed in U.S. Pat. No. 6,911,676.

FIG. 36 is a view illustrating an example of the semiconductor light emitting device proposed in U.S. Pat. No. 6,911,676, in which two PN junction diodes A and B are formed on a substrate 100. According to the structure suggested here, a second semiconductor layer 500 of the PN junction diode A and a first semiconductor layer 300 of the PN junction diode B should be connected by an electrical connection 780, and a first semiconductor layer 300 of the PN junction diode B and a second semiconductor layer 500 of the PN junction diode A should also be electrically connected (not shown), thereby allowing the PN junction diode A to serve as a semiconductor light emitting device, while allowing the PN junction diode B to serve as an electrostatic protection element.

Figure 37:
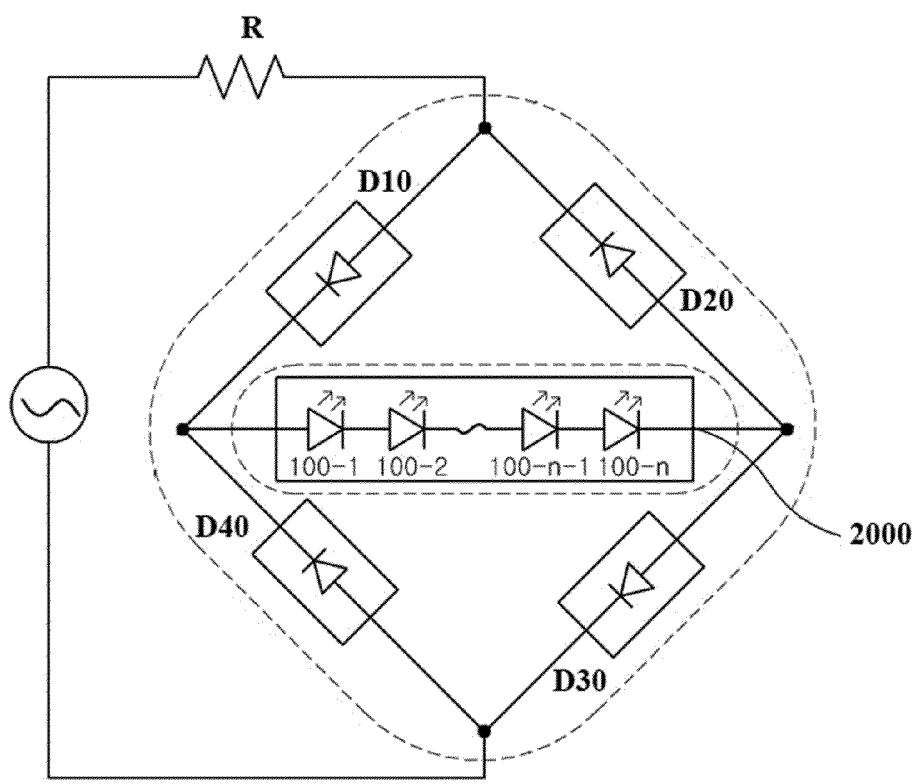
FIG. 37 is a view illustrating yet another example of the semiconductor light emitting device in the art.

FIG. 37 is a view illustrating yet another example of the semiconductor light emitting device in the art. According to the structure suggested here, semiconductor light emitting devices 100-1, 100-2, . . . , 100-n-1, and 100-n are connected in series to form a light emitting part 2000, and the light emitting part 2000 is then wired to four PN junction diodes D10, D20, D30 and D40.

Figure 38:
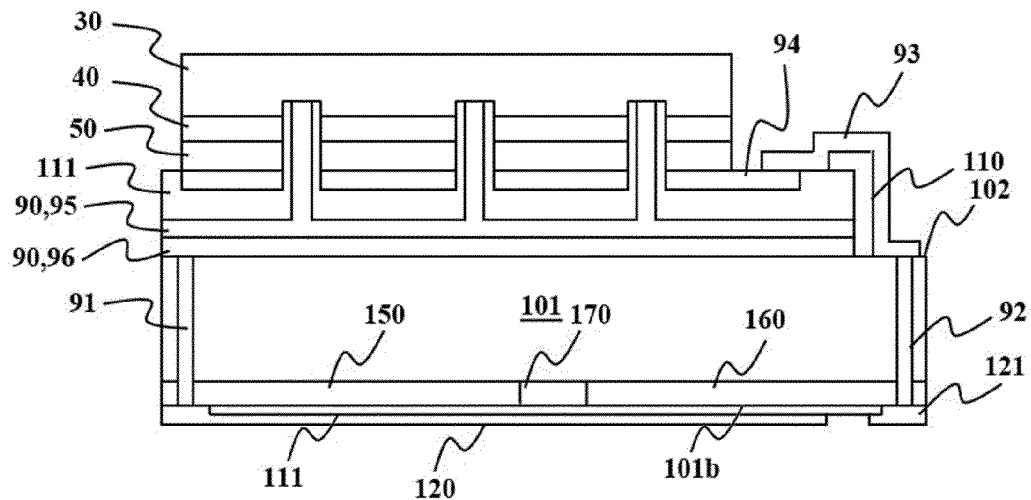
FIG. 38 is a view illustrating yet another example of the semiconductor light emitting device according to the present disclosure.

FIG. 38 is a view illustrating yet another example of the semiconductor light emitting device according to the present disclosure. In contrast to the semiconductor light emitting device shown in FIG. 12, a first conductive part 150 having a different conductivity (e.g. p-type) from the first conductivity (e.g. n-type) of the first semiconductor layer 30, and a second conductive part 160 having the same conductivity (e.g. n-type) as the first conductivity of the first semiconductor layer 30 are formed on the side of the second surface 101b which is the bottom face of the supporting substrate 101. The supporting substrate 101 is composed of semiconductors such as AlN, undoped Si and SiC, and impurities introduced into the semiconductor by ion implantation for example, such that it shows n-type conductivity, p-type conductivity or neutrality. The conductivity is a relative concept. The impurities may be introduced either before or after the formation of the first and second electrical passes 91 and 92 on the supporting substrate 101. Like or similar elements designated by the same reference numerals will not be explained. As needed for designing, an up-doping layer 170 may be or may not be present between the first conductive part 150 and the second conductive part 160.

Figure 39:
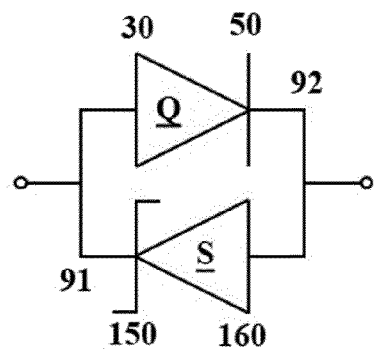
FIG. 39 is a view illustrating an electrical coupling relationship of the semiconductor light emitting device shown in FIG. 38.

FIG. 39 is a view illustrating an electrical coupling relationship of the semiconductor light emitting device shown in FIG. 38, in which a light emitting part Q formed of a plurality of semiconductor layers 30, 40 and 50 and a PN junction diode S formed of first and second conductive parts 150 and 160 are connected in parallel in the reverse direction by wiring provided by the first and second electrical passes 91 and 92, thereby allowing the PN junction diode S to serve as an electrostatic protection element. In the light emitting device shown in FIG. 38, the light emitting part Q does not necessarily have to have all features of the semiconductor light emitting device shown in FIG. 12. This electrical coupling relationship can be applied to various types of semiconductor light emitting devices including ones shown in FIG. 12 to FIG. 35.

Figure 40:
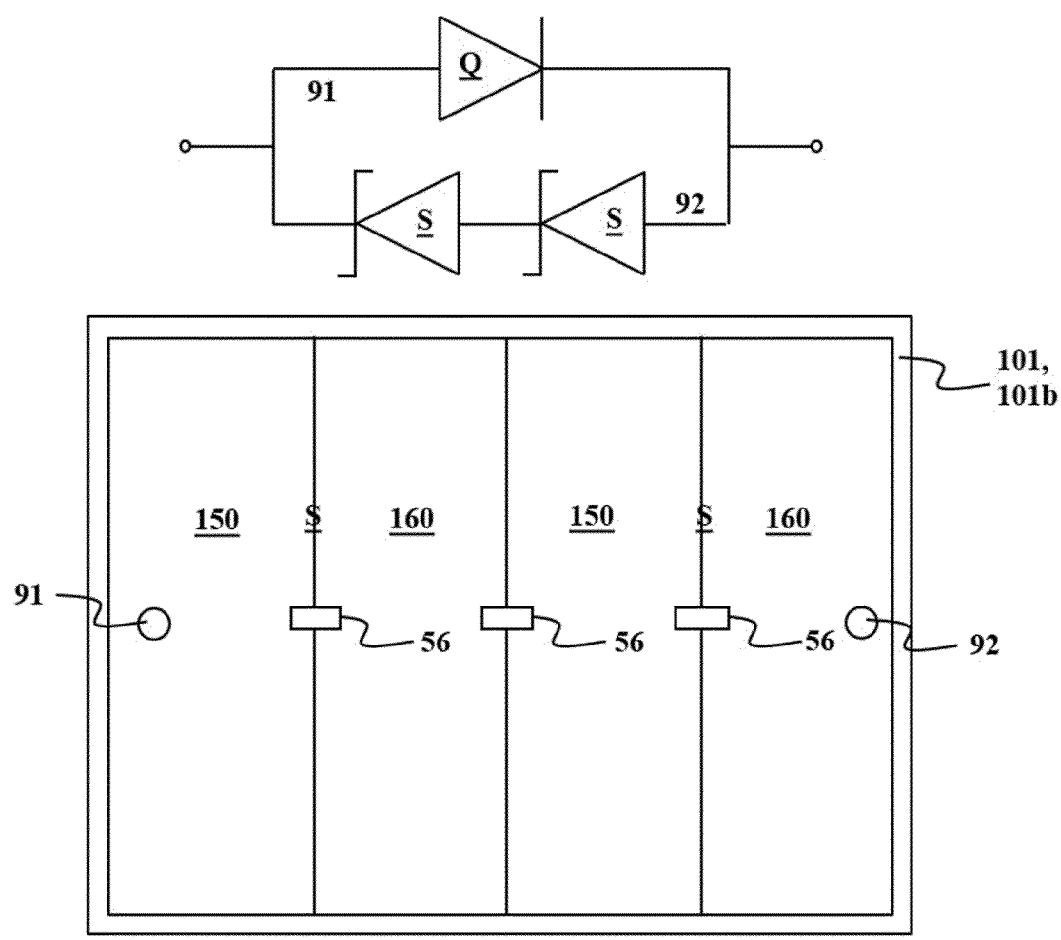
FIG. 40 is a view illustrating yet another example of the semiconductor light emitting device according to the present disclosure.

FIG. 40 is a view illustrating yet another example of the semiconductor light emitting device according to the present disclosure, which is seen from the second surface 101b of the supporting substrate 101. In contrast to the semiconductor light emitting device shown in FIG. 38, the first conductive part 150—the second conductive 160—the first conductive part 150—the second conductive part 160 are sequentially formed on the supporting substrate 101, forming two PN junction diodes S and S. Instead of using one PN junction diode S, a plurality of PN junction diodes S and S can be employed depending on the demanding properties or specifications of the supporting substrate 101. If appropriate, the first conductive part 150 may be electrically connected with the second conductive part 160 by a metallic wire 56. Further, as shown in FIG. 21, it is also possible to divide the plurality of semiconductor layers 30, 40 and 50 into a plurality of light emitting parts, e.g. a semiconductor stack A and a semiconductor stack B, and then connect them in series using an electrical connection 93.

Figure 41:
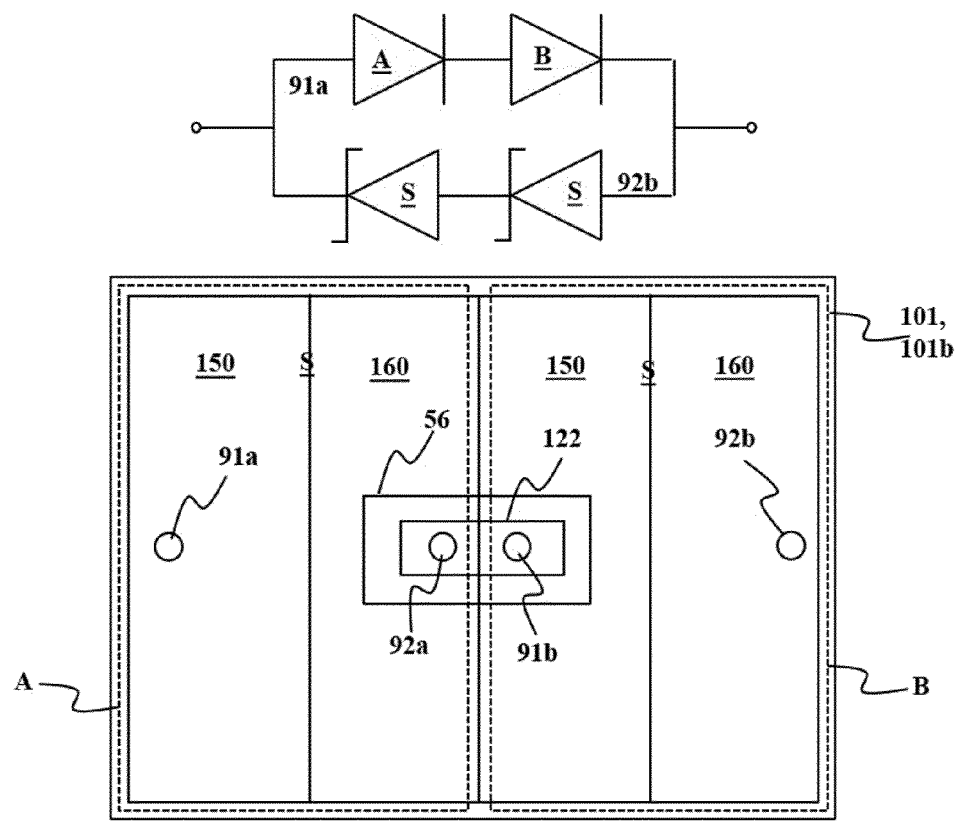
FIG. 41 is a view illustrating yet another example of the semiconductor light emitting device according to the present disclosure.

FIG. 41 is a view illustrating yet another example of the semiconductor light emitting device according to the present disclosure, which is applied to the semiconductor light emitting device shown in FIG. 32. The second electrical pass 92a of the semiconductor stack A is electrically connected with the first electrical pass 91b of the semiconductor stack B by an electrical connection 122 such that the semiconductor stack A and the semiconductor stack B are connected in series. Impurities are not doped over the region where the electrical connection 122 is positioned, which in turn prevents any electrical contact with those two serially connected PN junction diodes S and S so as to form the electrical coupling relationship as shown in the drawing. Additionally, it is possible to form the electrical coupling relationship in diverse configurations.

Figure 42:
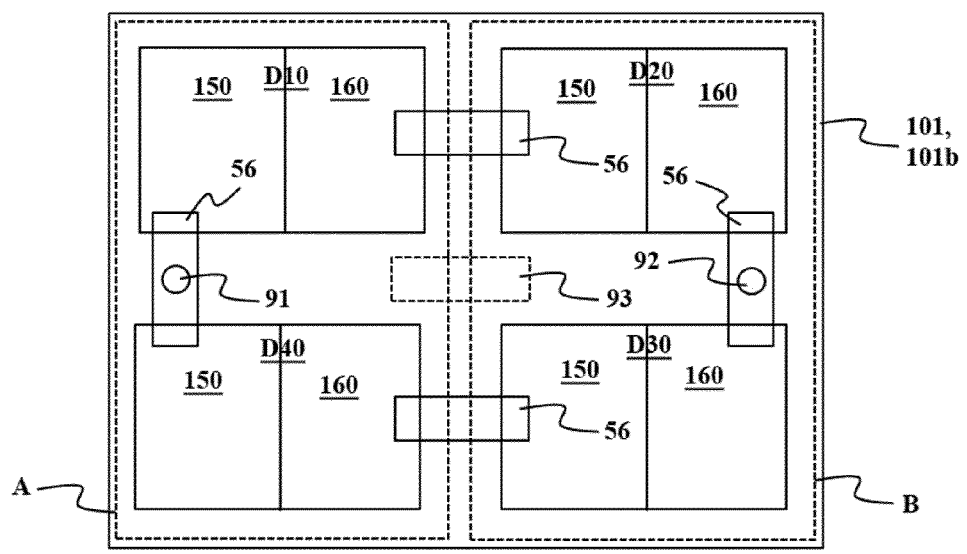
FIG. 42 is a view illustrating yet another example of the semiconductor light emitting device according to the present disclosure.

FIG. 42 is a view illustrating yet another example of the semiconductor light emitting device according to the present disclosure. Here, two semiconductor stacks A and B which are phosphors are connected in series by an electrical connection 93, the structure corresponding to the light emitting part 2000 shown in FIG. 37 is formed to ensure a sufficient space for the supporting substrate 101, and four PN junction diodes D10, D20, D30 and D40 are formed by using first and second conductive parts 150 and 160 and are connected by employing a metallic wire 56, so as to form a rectifier circuit as in FIG. 37. Further, the PN junction diodes and/or metallic wire 56 can also be used for forming, for example, different diodes, transistors, circuits of certain functions on the supporting substrate 101.

Figure 43:
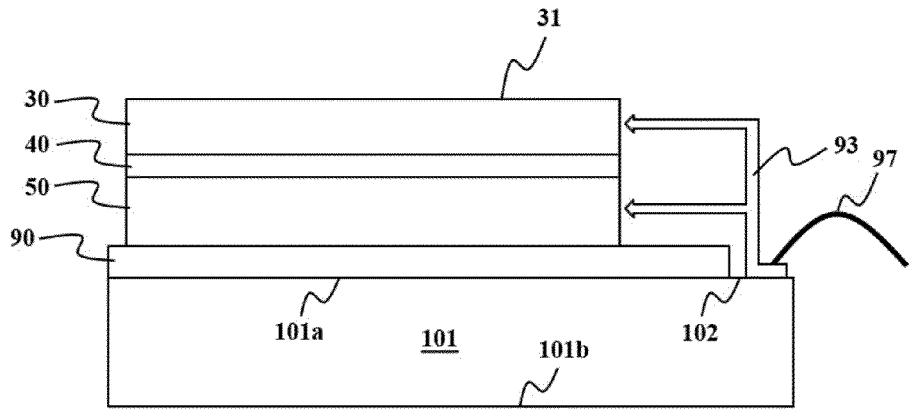
FIG. 43 is a view illustrating yet another example of the semiconductor light emitting device according to the present disclosure.

FIG. 43 is a view illustrating yet another example of the semiconductor light emitting device according to the present disclosure. In contrast to the semiconductor light emitting device in FIG. 6, the electrical connection 93 is built in such a way that it receives power from outside through a wire 97.

Figure 44:
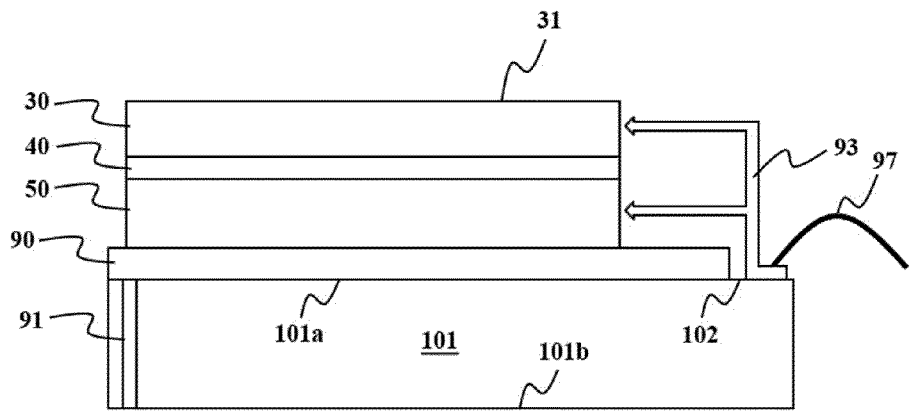
FIG. 44 is a view illustrating yet another example of the semiconductor light emitting device according to the present disclosure.

FIG. 44 is a view illustrating yet another example of the semiconductor light emitting device according to the present disclosure, in which the supporting substrate 101 has a first electrical pass 91, and the first electrical pass 91 is connected to a bonded layer 90.

Figure 45:
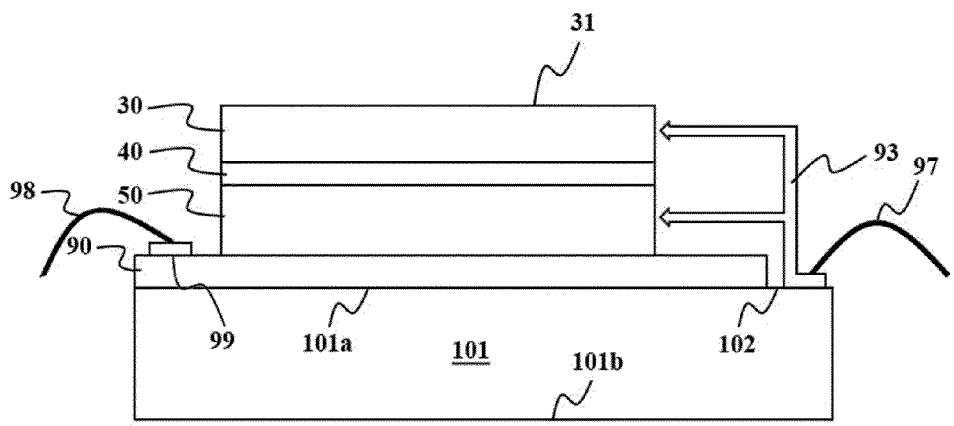
FIG. 45 is a view illustrating yet another example of the semiconductor light emitting device according to the present disclosure.

FIG. 45 is a view illustrating yet another example of the semiconductor light emitting device according to the present disclosure. In contrast to the one in FIG. 44, the supporting substrate 101 does not have a first electrical pass 91, and the bonded layer 90 is connected by a wire 98. Preferably, the bonded layer 90 has a pad electrode 99 to facilitate wire bonding, and the uppermost layer of the pad electrode 99 is composed of Au. While the pad electrode 99 may be a single Au layer, it can also have a Cr/Ni/Au configuration.

Figure 46:
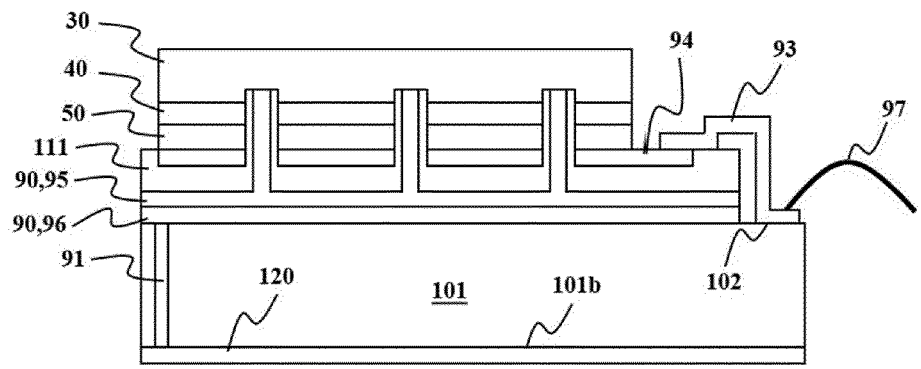
FIG. 46 is a view illustrating an example where the concept of the semiconductor light emitting device of FIG. 44 is applied to the semiconductor light emitting device shown in FIG. 12.

FIG. 46 is a view illustrating an example where the concept of the semiconductor light emitting device of FIG. 44 is applied to the semiconductor light emitting device shown in FIG. 12, in which a wire 97 is connected with the electrical connection 93. Like or similar elements designated by the same reference numerals will not be explained.

Figure 47:
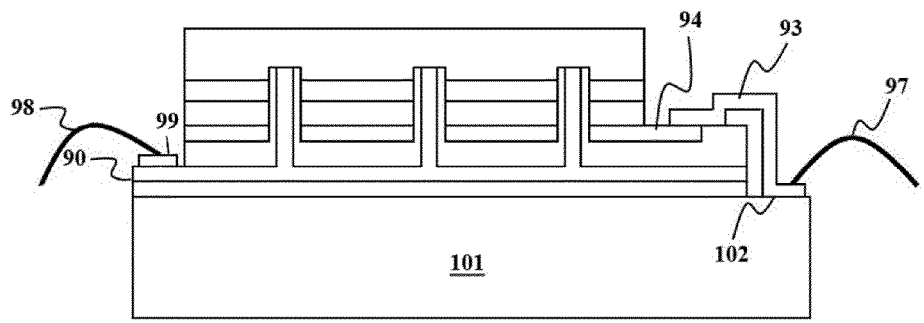
FIG. 47 is a view illustrating an example where the concept of the semiconductor light emitting device of FIG. 45 is applied to the semiconductor light emitting device shown in FIG. 12.

FIG. 47 is a view illustrating an example where the concept of the semiconductor light emitting device of FIG. 45 is applied to the semiconductor light emitting device shown in FIG. 12, in which the first electrical pass 91 is absent, and the bonded layer 90 is connected to the wire 98 through a pad electrode 99. Like or similar elements designated by the same reference numerals will not be explained. The rear electrode 120 may be omitted.

Needless to say, the concept suggested in FIG. 44 and FIG. 45 can be applied to the semiconductor light emitting devices shown in FIGS. 13, 14 and 15, by replacing the second electrical connection 92 with a wire.

Figure 48:
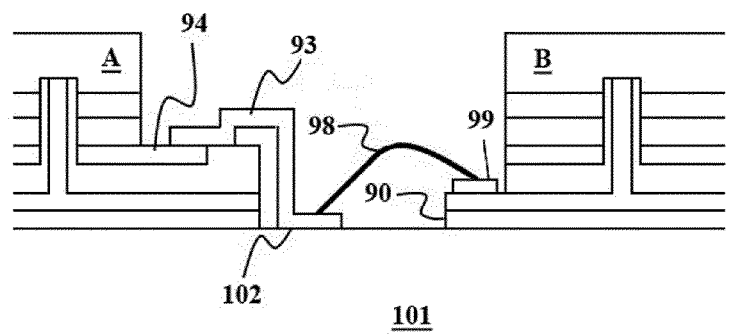
FIG. 48 and FIG. 49 are views illustrating various methods of electrical coupling in the semiconductor light emitting device shown in FIG. 43.
Figure 49:
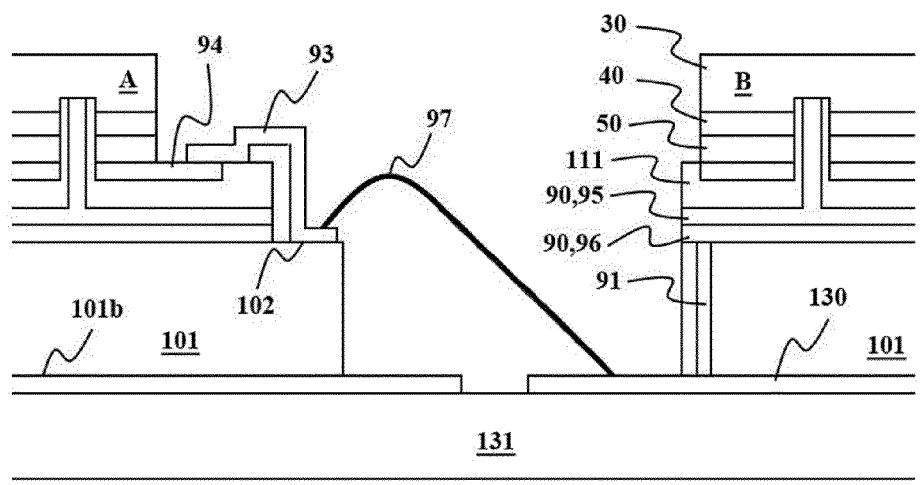

FIG. 48 and FIG. 49 are views illustrating various methods of electrical coupling in the semiconductor light emitting device shown in FIG. 43. In FIG. 48, on a single supporting substrate 101, an electrical connection 93 of the semiconductor light emitting device or the semiconductor stack A is serially connected to a pad electrode 99 of the semiconductor light emitting device or the semiconductor stack B, through a wire 98. In FIG. 49, the semiconductor light emitting device or the semiconductor stack A, and the semiconductor light emitting device or the semiconductor stack B are provided on an electrical pattern 130 of a separate substrate 131 such as PCB or COB, and an electrical connection 93 of the semiconductor light emitting device or the semiconductor stack A is serially connected to a first electrical pass 91, through the electrical pattern 130. Diverse electrical connections including serial connections as well as parallel connections can be possible. In FIG. 48, the supporting substrate 101 can be separated.

Herein below, there will be explained a variety of embodiments of the present disclosures.

(1) A semiconductor light emitting device, comprising: a plurality of semiconductor layers that grows sequentially on a growth substrate, with the plurality of semiconductor layers including a first semiconductor layer having a first conductivity and a growth substrate-removed surface formed on the side thereof, a second semiconductor layer having a second conductivity different from the first conductivity, and an active layer interposed between the first semiconductor layer and the second semiconductor layer, generating light via electron-hole recombination; a supporting substrate having a first surface and a second surface opposite to the first surface, wherein a first electrical pass via which either electrons or holes are transferred to the plurality of semiconductor layers, and a second electrical pass via which either electrons or holes whichever have not been transferred via the first electrical pass are transferred to the plurality of semiconductor layers continue from the second surface to the first surface; a bonded layer, which bonds the second semiconductor layer side of the plurality of semiconductor layers to the first surface side of the supporting substrate and is electrically connected with the first electrical pass; a bonded layer-removed surface formed on the first surface, exposing the second electrical pass and being open towards the plurality of semiconductor layer; and an electrical connection for electrically connecting the plurality of semiconductor layers with the second electrical pass exposed on the bonded layer-removed surface such that either electrons or holes whichever have not been transferred via the first electrical pass are transferred to the plurality of semiconductor layers. Here, the bonded layer means a layer formed after bonding, not any layer to be bonded before bonding which is formed either of the plurality of semiconductors or the supporting substrate.

(2) A semiconductor light emitting device, wherein the first electrical pass is electrically connected to the first semiconductor layer via the bonded layer, and the second electrical pass is electrically connected to the second semiconductor layer via the electrical connection.

(3) A semiconductor light emitting device, further comprising: a first conductive layer which is exposed upon the removal of the plurality of semiconductor layers for connection with the electrical connection, and is electrically connected to the second semiconductor layer. Here, the first conductive layer can be only metal(s)(for examples: Ag, Ni, Ag/Ni) or metal(s) with any metal oxide(s)(for examples: ITO). It has usually a reflection function and can be used in combination with a non-conductive structure such as ODR and/or DBR.

(4) A semiconductor light emitting device, wherein the first electrical pass is electrically connected to the second semiconductor layer via the bonded layer, and the second electrical pass is electrically connected to the first semiconductor layer via the electrical connection.

(5) A semiconductor light emitting device, further comprising: a second conductive layer which is exposed upon the removal of the plurality of semiconductor layers for connection with the electrical connection, and is electrically connected to the first semiconductor layer. Here, the second conductive layer functions to supply electricity to the first semiconductor layer and can be used as a part of the bonded layer.

(6) A semiconductor light emitting device, wherein the plurality of semiconductor layers are all covered by the bonded layer, when projected in a direction from the plurality of semiconductor layers to the supporting substrate.

(7) A semiconductor light emitting device, further comprising: an electric contact which is exposed on the opposite side of the supporting substrate with respect to the bonded layer, and interworks with the electrical connection for use in probing of the semiconductor light emitting device.

(8) A method for manufacturing a semiconductor light emitting device, comprising the steps of: preparing a plurality of semiconductor layers that grows sequentially on a growth substrate, with the plurality of semiconductor layers including a first semiconductor layer having a first conductivity and a growth substrate-removed surface being formed on the side thereof, a second semiconductor layer having a second conductivity different from the first conductivity, and an active layer interposed between the first semiconductor layer and the second semiconductor layer, generating light via electron-hole recombination; preparing a supporting substrate having a first surface and a second surface opposite to the first surface, wherein a first electrical pass via which either electrons or holes are transferred to the plurality of semiconductor layers, and a second electrical pass via which either electrons or holes whichever have not been transferred via the first electrical pass are transferred to the plurality of semiconductor layers are provided; bonding the plurality of semiconductor layers side on the opposite side of the growth substrate with the first surface side of the supporting substrate, such that a bonded layer is formed on the bonded region and the first electrical pass is electrically connected to the plurality of semiconductor layers via the bonded layer; removing the substrate; removing the bonded layer so as to expose the second electrical pass; and electrically connecting the second electrical pass with the plurality of semiconductor layer such that either electrons or holes whichever have not been transferred via the first electrical pass are transferred to the plurality of semiconductor layers.

(9) A method for manufacturing a semiconductor light emitting device, wherein the bonded layer removing step includes removing the plurality of semiconductor layers.

(10) A method for manufacturing a semiconductor light emitting device, wherein the step of removing the bonded layer includes isolating the plurality of semiconductor layers for producing individual chips, and removing the bonded layer to expose the second electrical pass.

(11) A method for manufacturing a semiconductor light emitting device, wherein the plurality of semiconductor layers has a conductive layer electrically connected to one of the first and second semiconductor layers, and the method further comprises, prior to the electrical connecting step, the step of removing the plurality of semiconductor layers to expose the conductive layer.

(12) A method for manufacturing a semiconductor light emitting device, wherein the conductive layer is electrically connected to the second semiconductor layer.

(13) A method for manufacturing a semiconductor light emitting device, wherein the conductive layer is electrically connected to the first semiconductor layer.

(14) A method for manufacturing a semiconductor light emitting device, wherein in the electrical connecting step, the second electrical pass continues to the plurality of semiconductor layers having the growth substrate been removed therefrom.

(15) A method for manufacturing a semiconductor light emitting device, wherein prior to the bonding step, a part of the plurality of semiconductor layers is removed.

(16) A method for manufacturing a semiconductor light emitting device, wherein in the bonding step, both the first electrical pass and the second electrical pass are bonded to the bonded layer.

(17) A method for manufacturing a semiconductor light emitting device, wherein in the bonding step, the bonded layer is formed all over the first surface of the supporting substrate.

(18) A semiconductor light emitting device, comprising: a supporting substrate having a first surface, a second surface opposite to the first surface and first and second electrical passes extended from the first surface to the second surface; at least two semiconductor stacks (which are referred to a first semiconductor stack and a second semiconductor stack) formed on the first surface, wherein each stack includes a plurality of semiconductor layers grown sequentially using a growth substrate and composed of a first semiconductor layer having a first conductivity, a second semiconductor layer having a second conductivity different from the first conductivity, and an active layer interposed between the first semiconductor layer and the second semiconductor layer and generating light via electron-hole recombination, and wherein a growth substrate-removed surface is formed on the side of the first semiconductor layer; a bonded layer, which bonds the second semiconductor layer side of the plurality of semiconductor layers to the first surface side of the supporting substrate; and an electrical connection connecting the first semiconductor stack to at least one of the first and second electrical passes of the second semiconductor stack on the second side.

(19) A semiconductor light emitting device, wherein the electrical connection connecting the second electrical pass of the first semiconductor stack with the first electrical pass of the second semiconductor stack.

(20) A semiconductor light emitting device, wherein the second electrical pass of the first semiconductor stack and the first electrical pass of the second semiconductor stack are incorporated.

(21) A semiconductor light emitting device, wherein the electrical connection is covered with an insulating layer, on which a rear electrode electrically connected with one of the first semiconductor stack and the second semiconductor stack, is formed.

(22) A semiconductor light emitting device, wherein the first electrical pass of the first semiconductor stack and the first electrical pass of the second semiconductor stack are connected, and wherein the second electrical pass of the first semiconductor stack and the second electrical pass of the second semiconductor stack are connected. In FIG. 28, six semiconductor stacks are illustrated for explanation but two semiconductor stack connected in parallel can be more easily understood.

(23) A semiconductor light emitting device, wherein the first electrical pass of the first semiconductor stack and the second electrical pass of the second semiconductor stack are connected, and wherein the second electrical pass of the first semiconductor stack and the first electrical pass of the second semiconductor stack are connected. This means an electrical connection in reverse parallel. In FIG. 31, six semiconductor stacks are illustrated for explanation but two semiconductor stack connected in reverse parallel can be more easily understood.

(24) A semiconductor light emitting device comprising: a bonded layer-removed surface formed on the first surface, being open towards the plurality of semiconductor layer. The technical concept of the present disclose explained from FIG. 23 can be easily combined with that explained in FIG. 6. However, the examples in FIGS. 33 and 34 are different with that in FIG. 32 in that at the bonded layer-removed surface the second electrical pass 92a is not exposed (or it is covered by the bonded layer 90).

(25) A semiconductor light emitting device comprising: an additional electrical connection providing the other of the electron and the hole to the plurality of the semiconductor layers from the second electrical pass.

(26) A semiconductor light emitting device, wherein the bonded layer of the second semiconductor stack is covered by the second electrical pass of the first semiconductor stack.

(27) A semiconductor light emitting device, comprising: a plurality of semiconductor layers grown sequentially using a growth substrate and composed of a first semiconductor layer having a first conductivity, a second semiconductor layer having a second conductivity different from the first conductivity, and an active layer interposed between the first semiconductor layer and the second semiconductor layer and generating light via electron-hole recombination; a supporting substrate bonded with the plurality of the semiconductor layers for supporting it and made of semiconductor material, and having a first surface, a second surface opposite to the first surface and first and second electrical passes extended from the second surface to the first surface the first electrical pass supplying one of the electron and the hole to the plurality of the semiconductor layers while the second electrical pass supplying the other of the electron and the hole to the plurality of the semiconductor layers; and at least one PN junction diode formed at the supporting substrate and electrically connected to the plurality of the semiconductor layers by the first and second electrical passes.

(28) A semiconductor light emitting device, wherein the at least one PN junction diode is connected with the plurality of the semiconductor layers in reverse parallel.

(29) A semiconductor light emitting device, wherein each of the at least one PN junction diode includes a first conductivity portion with a conductivity different with the first conductivity of the first semiconductor layer and a second conductivity portion with a conductivity same with the first conductivity of the first semiconductor layer and wherein the first electrical pass is electrically connected with the first conductivity portion and the second electrical pass is electrically connected with the second conductivity portion.

(30) A semiconductor light emitting device, wherein the supporting substrate is made of AlN.

(31) A semiconductor light emitting device, wherein the supporting substrate is made of Si.

(32) A semiconductor light emitting device, wherein the plurality of the semiconductor layers includes a growth substrate-removed surface on the first semiconductor side, the device includes a bonded layer, which bonds the second semiconductor layer side of the plurality of semiconductor layers to the first surface side of the supporting substrate, and is electrically connected with the first electrical pass, and an electrical connection electrically connects the second electrical pass exposed on the bonded layer-removed surface with the plurality of semiconductor layers, for transferring either electrons or holes.

(33) A semiconductor light emitting device, wherein the plurality of the semiconductor layers includes a plurality of semiconductor stacks.

(34) A semiconductor light emitting device, wherein the plurality of the semiconductor layers are electrically connected on the second surface side of the supporting substrate.

(35) A semiconductor light emitting device, wherein the plurality of the semiconductor layers are electrically connected on the first surface side of the supporting substrate.

(36) A semiconductor light emitting device, wherein the at least PN junction diode is electrically connected with the first and second electrical passes to form a rectification circuit.

(37) any combination of the above-described examples and any combination obvious to a skilled person in the art from the above-described examples.

(38) A semiconductor light emitting device, comprising: a plurality of semiconductor layers grown sequentially using a growth substrate and composed of a first semiconductor layer having a first conductivity, a second semiconductor layer having a second conductivity different from the first conductivity, and an active layer interposed between the first semiconductor layer and the second semiconductor layer and generating light via electron-hole recombination; a supporting substrate bonded with the plurality of the semiconductor layers for supporting it and made of semiconductor material, and having a first surface, a second surface opposite to the first surface and first and second electrical passes extended from the second surface to the first surface the first electrical pass supplying one of the electron and the hole to the plurality of the semiconductor layers while the second electrical pass supplying the other of the electron and the hole to the plurality of the semiconductor layers; and at least one electrostatic protection element integrated into the supporting substrate, the electrostatic protection element being electrically connected with the plurality of semiconductor layers by the first and second electrical passes.

(39) A semiconductor light emitting device, comprising: a plurality of semiconductor layers grown sequentially using a growth substrate and composed of a first semiconductor layer having a first conductivity, a second semiconductor layer having a second conductivity different from the first conductivity, and an active layer interposed between the first semiconductor layer and the second semiconductor layer and generating light via electron-hole recombination, and wherein a growth substrate-removed surface is formed on the side of the first semiconductor layer; a supporting substrate having a first surface and a second surface opposite to the first surface; a bonded layer, which bonds the second semiconductor layer side of the plurality of semiconductor layers to the first surface side of the supporting substrate; a bonded layer-removed surface formed on the first surface, being open towards the plurality of semiconductor layer; an electrical connection formed at the first surface and extended onto the bonded layer-removed surface from the plurality of the semiconductor layer to supply one of the electron and the hole; and a wire connecting the electrical connection to outside.

(40) A semiconductor light emitting device, comprising: an additional wire for transferring the other of the electron and the hole to the plurality of semiconductor layers through the bonded layer.

(41) A semiconductor light emitting device, comprising: a pad electrode positioned between the additional wire and the bonded layer.

(42) A semiconductor light emitting device, wherein the first electrical pass is electrically connected with the first semiconductor layer, passing through the bonded layer, and the wire is electrically connected with the second semiconductor layer, passing through the electrical connection.

(43) A semiconductor light emitting device, wherein the wire is electrically connected with the first semiconductor layer, passing through the electrical connection.

(44) A semiconductor light emitting device, wherein at least two semiconductor stacks (which are referred to a first semiconductor stack and a second semiconductor stack) is provided, for each semiconductor stack the supporting substrate is provide with a first electrical pass extended from the second surface to supply one of the electron and the hole and a second electrical pass to supply the of the electron and the hole, the boned layer is electrically connected with the first electrical pass, and an electrical connection is provided at the second surface side for connecting the first semiconductor stack with at least one of the first and second electrical passes of the second semiconductor stack.

A semiconductor light emitting device and a method for manufacturing the same according to the present disclosure make it possible to obtain a TFFC (Thin Film Flip Chip)-type semiconductor light emitting device.

Another semiconductor light emitting device and a method for manufacturing the same according to the present disclosure make it possible to obtain a TFFC-type semiconductor light emitting device at the wafer level.

Yet another semiconductor light emitting device and a method for manufacturing the same according to the present disclosure make it possible to accomplish a higher productivity without suffering from cracking of many semiconductor layers during the removal process of a growth substrate as well as in the processes after the removal.

Yet another semiconductor light emitting device and a method for manufacturing the same according to the present disclosure make it possible to accomplish a wafer-level TFFC-type semiconductor light emitting device featuring an easier alignment of electrodes.

In yet another semiconductor light emitting device and a method for manufacturing the same according to the present disclosure, it is possible to obtain various types of semiconductor light emitting devices by using a bonded layer removed surface and electrical connections continuing to a plurality of semiconductor layers, wires, as well as electrical passes passing through the supporting substrate.

In yet another semiconductor light emitting device and a method for manufacturing the same according to the present disclosure, it is possible to accomplish diverse types of electrical connections on the rear surface of the supporting substrate.

In yet another semiconductor light emitting device and a method for manufacturing the same according to the present disclosure, it is possible to provide the supporting substrate with various functions by forming PN junction diodes on the supporting substrate.

In yet another semiconductor light emitting device and a method for manufacturing the same according to the present disclosure, it is possible to facilitate the connection of a single semiconductor light emitting device or a plurality of semiconductor light emitting devices by using wires.

What is claimed:

1. A semiconductor light emitting device, comprising:
a supporting substrate having a first surface and a second surface opposite to the first surface;
at least one semiconductor stack formed on the first surface, wherein each stack includes a plurality of semiconductor layers grown sequentially using a growth substrate and composed of a first semiconductor layer having a first conductivity, a second semiconductor layer having a second conductivity different from the first conductivity, and an active layer interposed between the first semiconductor layer and the second semiconductor layer and generating light via electron-hole recombination, and wherein a growth substrate-removed surface is formed on a side of the first semiconductor layer;
a bonded layer, which bonds a second semiconductor layer side of the plurality of semiconductor layers to the first surface of the supporting substrate; and
a bonded layer-removed surface formed on the first surface, being open towards the plurality of semiconductor layer,
wherein at least two semiconductor stacks (which are referred to a first semiconductor stack and a second semiconductor stack) are provided,
the supporting substrate has a first electrical pass transferring either electrons or holes and a second electrical pass transferring either holes or electrons, for each of the semiconductor stacks, with the first electrical pass continuing to the first surface from the second surface,
the bonded layer is electrically connected with the first electrical pass, and
the semiconductor light emitting device further comprises an electrical connection for connecting the first semiconductor stack on a side of the second surface with at least one of the first and second electrical passes of the second semiconductor stack,
wherein the semiconductor light emitting device further comprises an additional electrical pass transferring either electrons or holes from the second electrical pass to the plurality of semiconductor layers.

2. The semiconductor light emitting device according to claim 1, wherein the electrical connection connects the second electrical pass of the first semiconductor stack with the first electrical pass of the second semiconductor stack.

3. The semiconductor light emitting device according to claim 1, wherein the second electrical pass of the first semiconductor stack and the first electrical pass of the second semiconductor stack are integrated.

4. The semiconductor light emitting device according to claim 1, wherein the electrical connection is covered with an insulating layer, and a rear electrode electrically connected with one of the first and second semiconductor stacks is formed on the insulating layer.

5. The semiconductor light emitting device according to claim 1, wherein the first electrical pass of the first semiconductor stack is connected with the first electrical pass of the second semiconductor stack, and the second electrical pass of the first semiconductor stack is connected with the second electrical pass of the second semiconductor stack.

6. The semiconductor light emitting device according to claim 1, wherein the first electrical pass of the first semiconductor stack is connected with the second electrical pass of the second semiconductor stack, and the second electrical pass of the first semiconductor stack is connected with the first electrical pass of the second semiconductor stack.

7. The semiconductor light emitting device according to claim 1, wherein the first semiconductor layer, the active layer and the second semiconductor layer are Group III-nitride semiconductors.

8. A semiconductor light emitting device, comprising:
a supporting substrate having a first surface and a second surface opposite to the first surface;
at least one semiconductor stack formed on the first surface, wherein each stack includes a plurality of semiconductor layers grown sequentially using a growth substrate and composed of a first semiconductor layer having a first conductivity, a second semiconductor layer having a second conductivity different from the first conductivity, and an active layer interposed between the first semiconductor layer and the second semiconductor layer and generating light via electron-hole recombination, and wherein a growth substrate-removed surface is formed on a side of the first semiconductor layer;
a bonded layer, which bonds a second semiconductor layer side of the plurality of semiconductor layers to the first surface of the supporting substrate; and
a bonded layer-removed surface formed on the first surface, being open towards the plurality of semiconductor layer to supply current thereto,
wherein at least two semiconductor stacks (which are referred to a first semiconductor stack and a second semiconductor stack) are provided,
the supporting substrate has a first electrical pass transferring either electrons or holes and a second electrical pass transferring either holes or electrons, for each of the semiconductor stacks, with the first electrical pass continuing to the first surface from the second surface,
the bonded layer is electrically connected with the first electrical pass, and
the semiconductor light emitting device further comprises an electrical connection for connecting the first semiconductor stack on a side of the second surface with at least one of the first and second electrical passes of the second semiconductor stack,
wherein the bonded layer of the second semiconductor stack covers the second electrical pass of the first semiconductor stack.

9. A semiconductor light emitting device, comprising:
a supporting substrate having a first surface and a second surface opposite to the first surface;
at least one semiconductor stack formed on the first surface, wherein each stack includes a plurality of semiconductor layers grown sequentially using a growth substrate and composed of a first semiconductor layer having a first conductivity, a second semiconductor layer having a second conductivity different from the first conductivity, and an active layer interposed between the first semiconductor layer and the second semiconductor layer and generating light via electron-hole recombination, and wherein a growth substrate-removed surface is formed on a side of the first semiconductor layer;
a bonded layer, which bonds a second semiconductor layer side of the plurality of semiconductor layers to the first surface of the supporting substrate; and
a bonded layer-removed surface formed on the first surface, being open towards the plurality of semiconductor layer to supply current thereto, wherein the supporting substrate is composed of a semiconductor and has a first electrical pass continuing to the first surface from the second surface, and a second electrical pass, the first electrical pass transferring either electrons or holes to the plurality of semiconductor layers, the second electrical pass transferring either holes or electrons to the plurality of semiconductor layers, and the semiconductor light emitting device further comprises:
at least one PN junction diode formed on the supporting substrate, the PN junction diodes being electrically connected with the plurality of semiconductor layers by the first and second electrical passes.

10. The semiconductor light emitting device according to claim 9, wherein the at least one PN junction diodes and the plurality of semiconductors are connected in parallel in a reverse direction.

11. The semiconductor light emitting device according to claim 9, wherein each of the at least one PN junction diode has a first conductive part having a different conductivity from the first conductivity of the first semiconductor layer, and a second conductive part having the same conductivity as the first conductivity of the first semiconductor layer, and the first electrical pass is electrically connected with the first conductive part, and the second electrical pass is electrically connected with the second conductive part.

12. The semiconductor light emitting device according to claim 9, wherein the supporting substrate is composed of AlN.

13. The semiconductor light emitting device according to claim 9, wherein the supporting substrate is composed of an undoped Si.

14. The semiconductor light emitting device according to claim 9, wherein the bonded layer is electrically connected with the first electrical pass, and the semiconductor light emitting device further comprises:
an electrical connection which is exposed to the bonded layer-removed surface through the second electrical pass, and electrically connects the second electrical pass exposed on the bonded layer-removed surface with the plurality of semiconductor layers, for transferring either electrons or holes.

15. The semiconductor light emitting device according to claim 9, wherein at least two semiconductor stacks are electrically connected on the side of the second surface of the supporting substrate.

16. The semiconductor light emitting device according to claim 9, wherein at least two semiconductor stacks are electrically connected on the side of the first surface of the supporting substrate.

17. The semiconductor light emitting device according to claim 9, wherein the at least one PN junction diodes is electrically connected with the first and second electrical passes to form a rectifier circuit.

18. The semiconductor light emitting device according to claim 9, wherein the supporting substrate is composed of a semiconductor and has a first electrical pass continuing to the first surface from the second surface, and a second electrical pass, the first electrical pass transferring either electrons or holes to the plurality of semiconductor layers, the second electrical pass transferring either holes or electrons to the plurality of semiconductor layers, and the semiconductor light emitting device further comprises:
at least one electrostatic protection element integrated into the supporting substrate, the electrostatic protection element being electrically connected with the plurality of semiconductor layers by the first and second electrical passes.

* * * * *